United States Patent [19]

Abbagnaro et al.

[11] Patent Number: 4,899,920
[45] Date of Patent: Feb. 13, 1990

[54] APPARATUS FOR REMOVAL AND INSTALLING ELECTRONIC COMPONENTS WITH RESPECT TO A SUBSTRATE

[75] Inventors: Louis A. Abbagnaro, Silver Spring; Robert G. Brown, Annapolis; William J. Siegel, Silver Spring; William J. Kautter, Columbia; Robert S. Quasney, Sr., Pasendena, all of Md.

[73] Assignee: Pace Incorporated, Laural, Md.

[21] Appl. No.: 340,772

[22] Filed: Apr. 20, 1989

Related U.S. Application Data

[62] Division of Ser. No. 158,724, Feb. 22, 1988.

[51] Int. Cl.⁴ ............................................. B23K 3/00
[52] U.S. Cl. ................................ 228/11; 228/180.2; 228/20; 219/364
[58] Field of Search ................ 228/6.2, 8, 9, 11, 13, 228/14, 20 HT, 20 R, 19, 21, 179, 180.2, 264; 219/364, 374, 375, 377, 373, 494, 510

[56] References Cited

U.S. PATENT DOCUMENTS

| | | | |
|---|---|---|---|
| 4,116,376 | 9/1978 | Delorme et al. | 228/180.2 |
| 4,426,571 | 1/1984 | Beck | 228/20 |
| 4,552,300 | 11/1985 | Zovko et al. | 228/264 |
| 4,561,584 | 12/1985 | Hug | 228/264 |
| 4,605,152 | 8/1986 | Fridman | 228/6.2 |
| 4,610,388 | 9/1986 | Kolturiak et al. | 228/20 |
| 4,659,004 | 4/1987 | Fridman | 228/9 |
| 4,696,096 | 9/1987 | Green et al. | 228/180.2 |
| 4,752,025 | 6/1988 | Stach et al. | 228/20 |
| 4,767,047 | 8/1988 | Todd et al. | 228/6.2 |
| 4,787,548 | 11/1988 | Abbagnaro et al. | 228/6.2 |

Primary Examiner—Nicholas P. Godici
Assistant Examiner—Michael William Starkweather
Attorney, Agent, or Firm—Sixbey, Friedman, Leedom and Ferguson

[57] ABSTRACT

This invention relates to a method and apparatus for removing and installing surface mounted devices (SMD's) with respect to a substrate such as a printed circuit board (PCB).

13 Claims, 22 Drawing Sheets

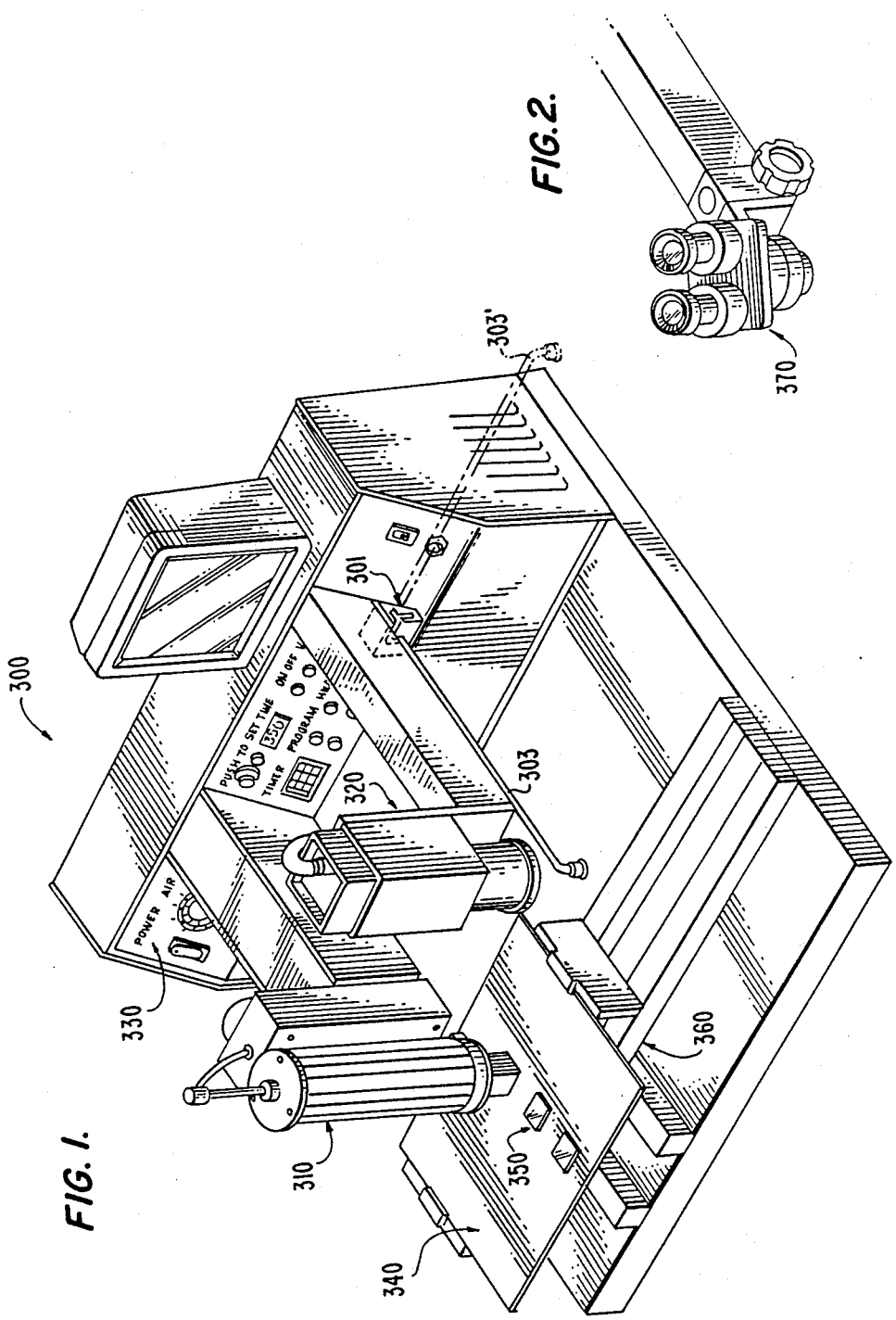

FIG. 12.
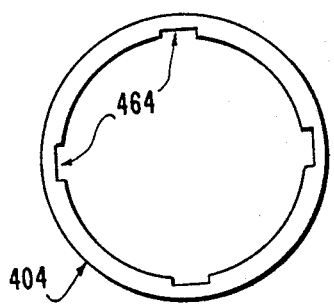
FIG. 14.
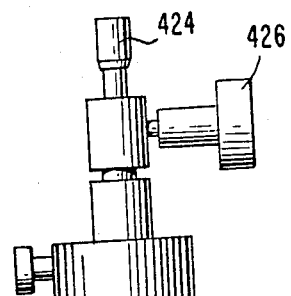
FIG. 13.
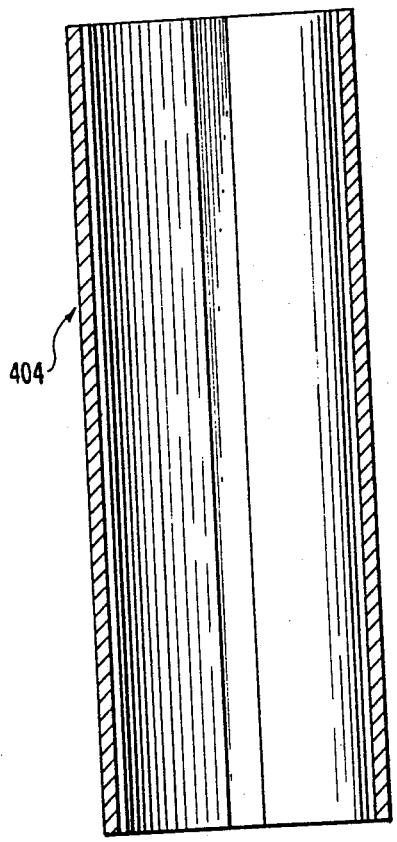
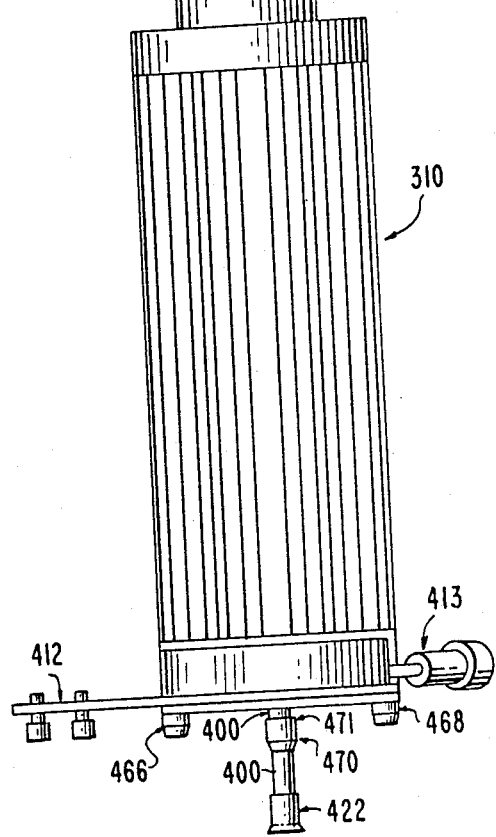

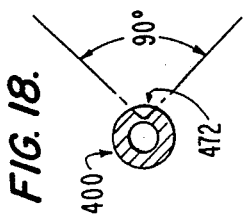
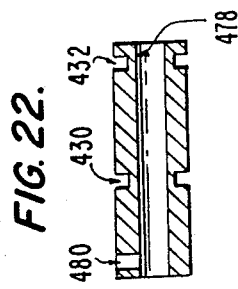
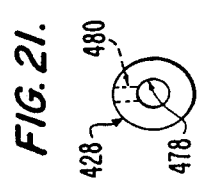
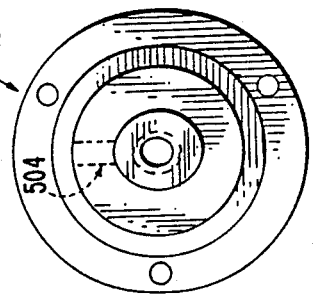
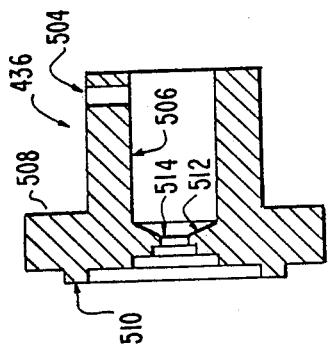

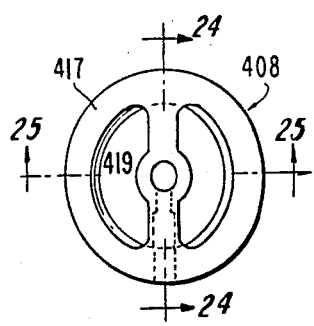
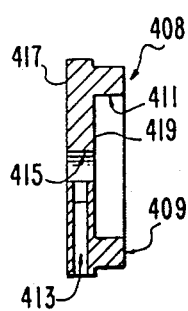
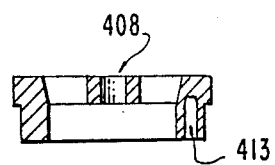
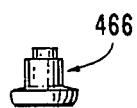
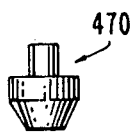
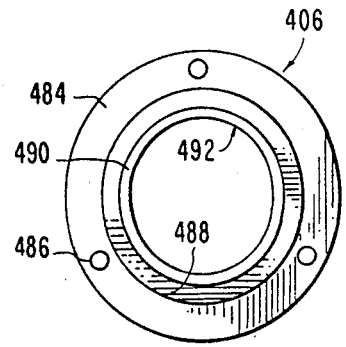
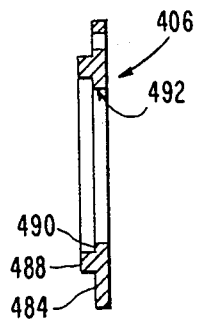
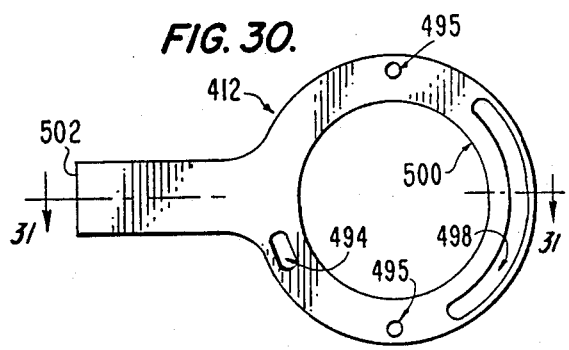

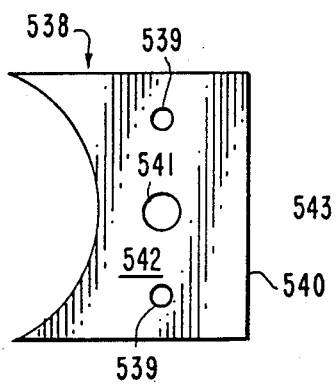
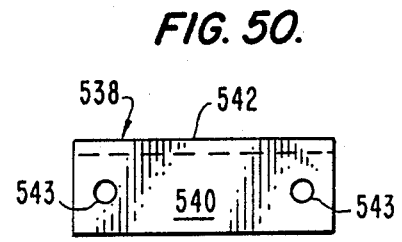
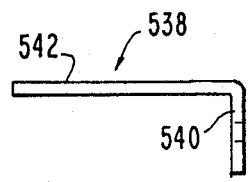
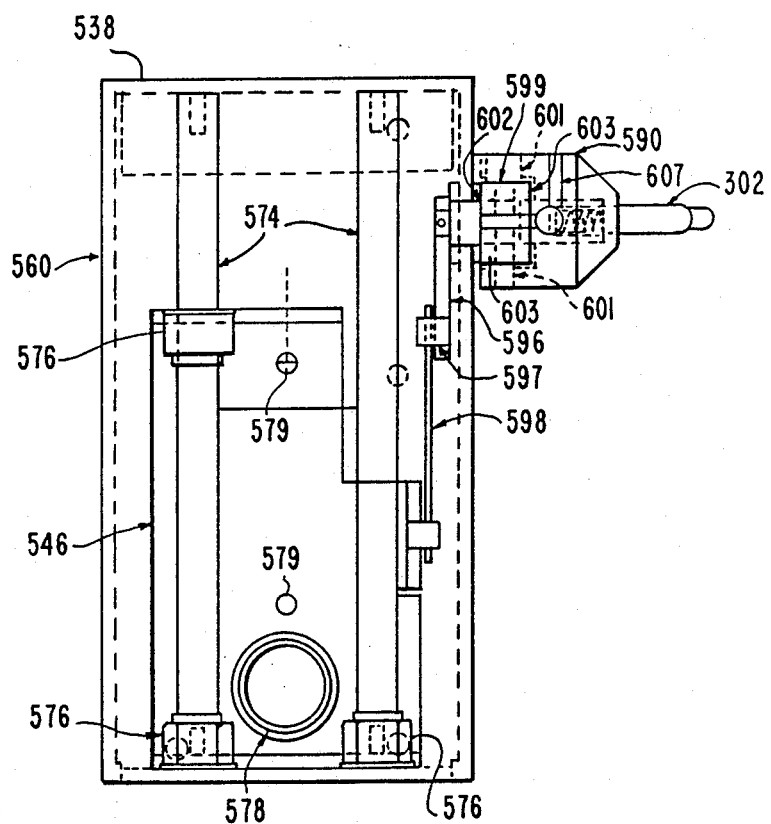

FIG. 52A.
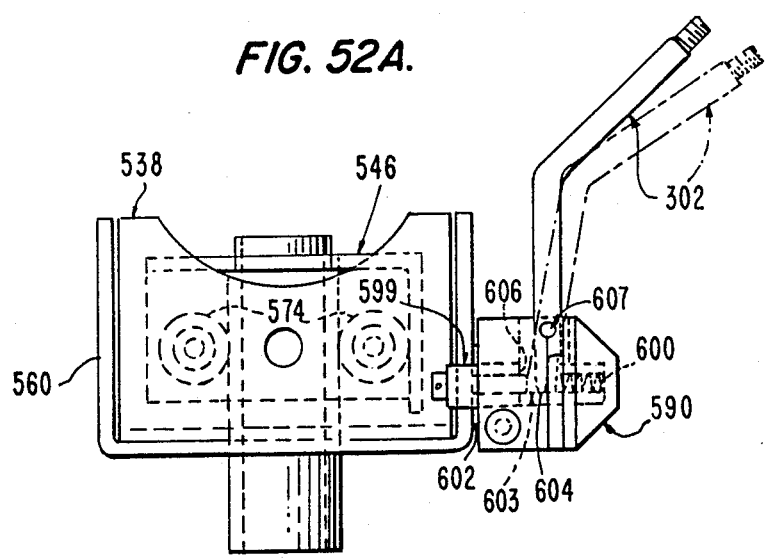
FIG. 52B.
LOCKED
FIG. 52C.
UNLOCKED
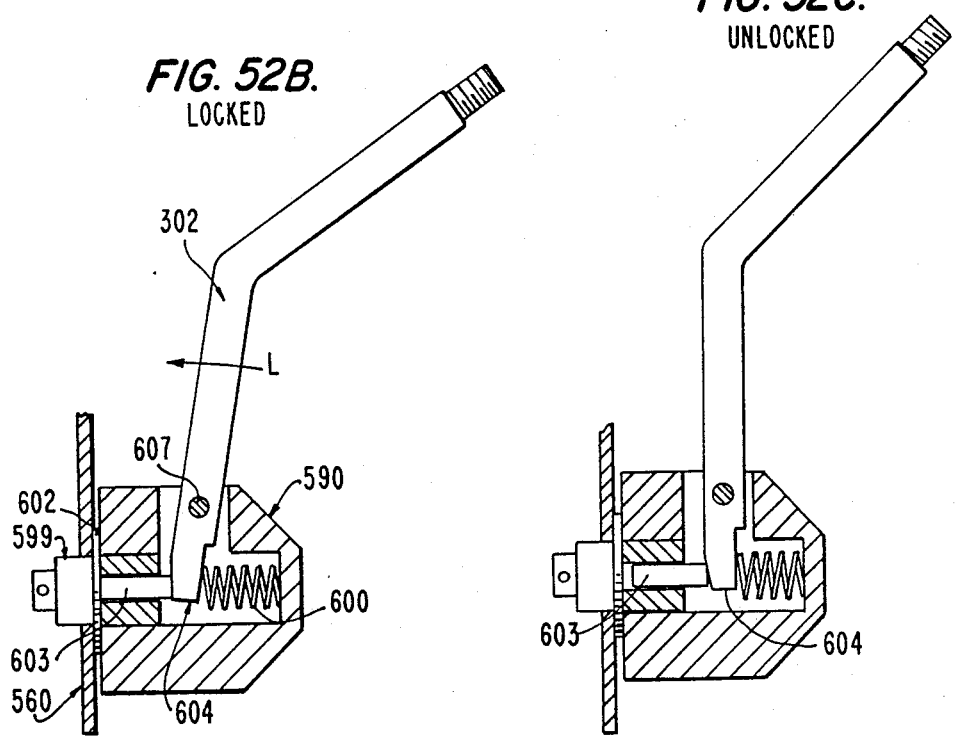

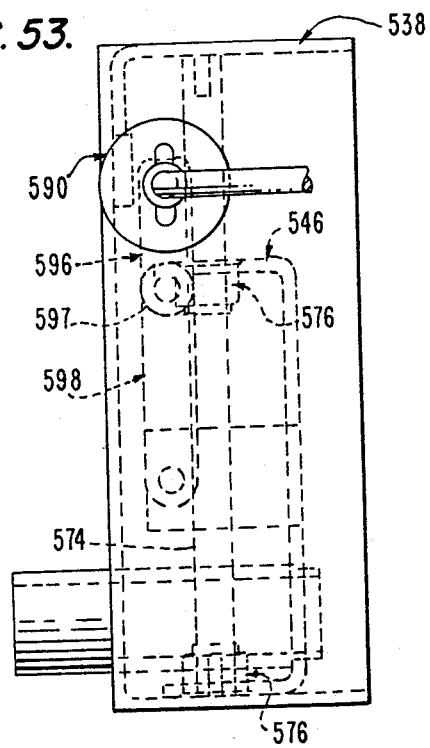
FIG. 53.
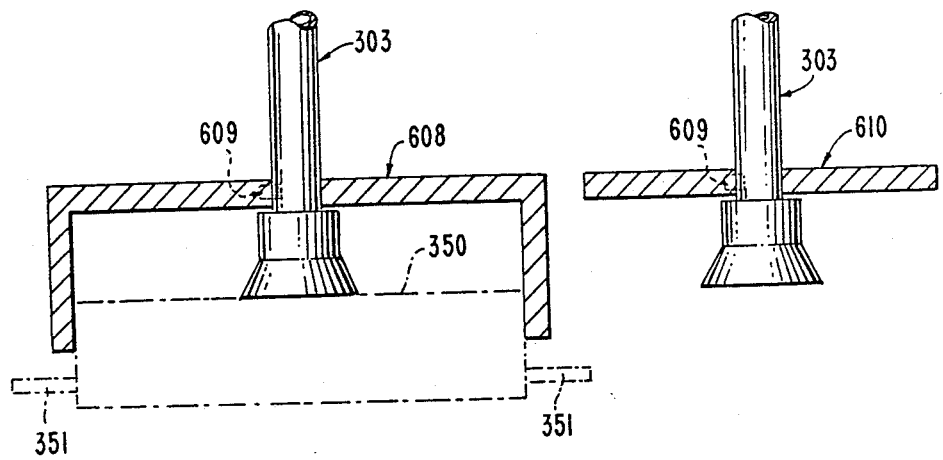
FIG. 54.
FIG. 55.

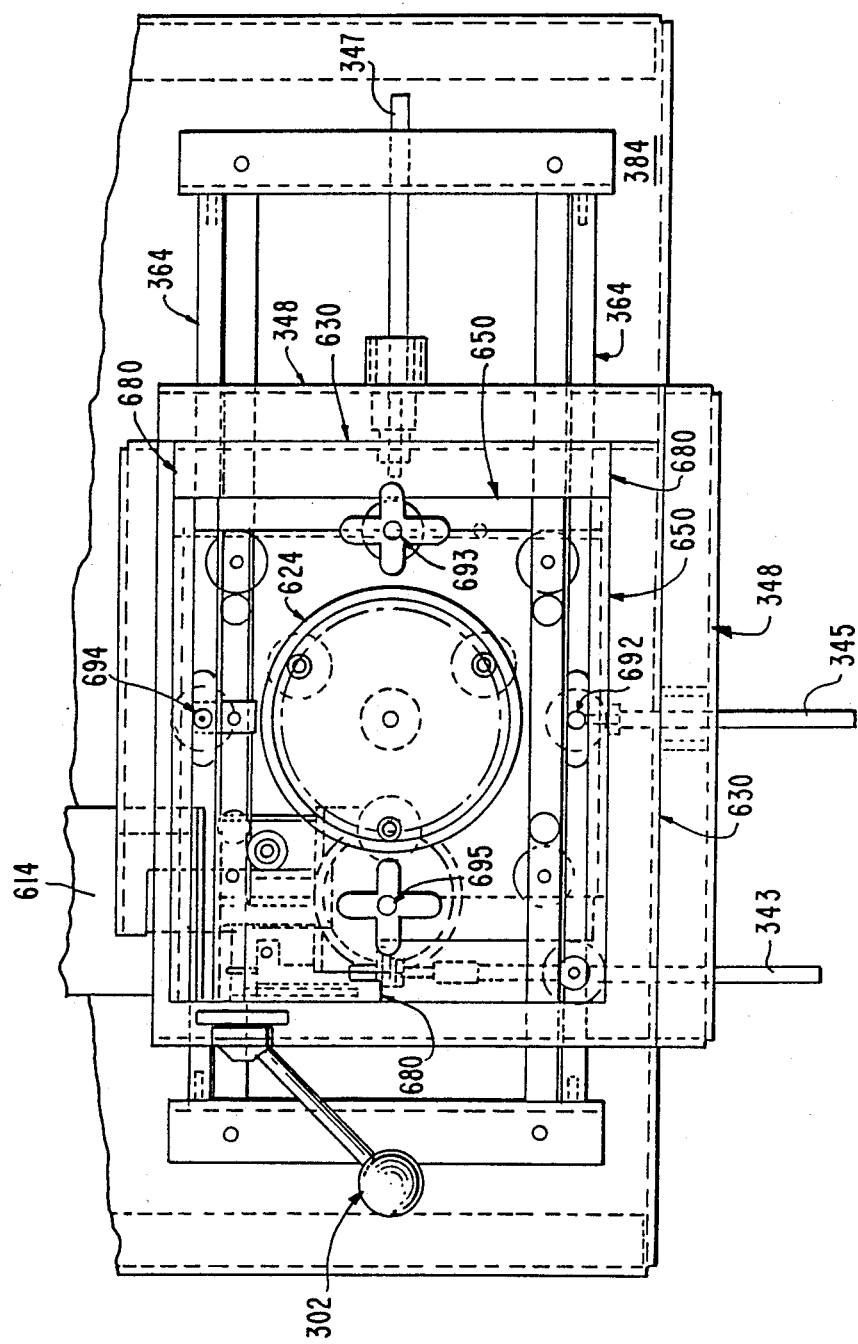

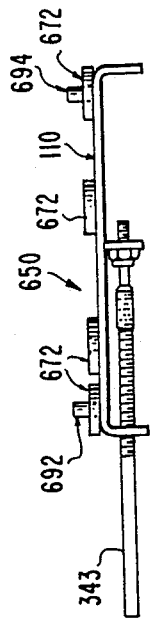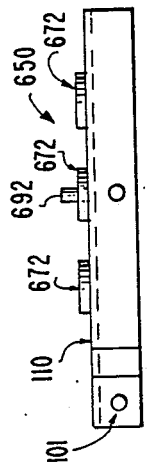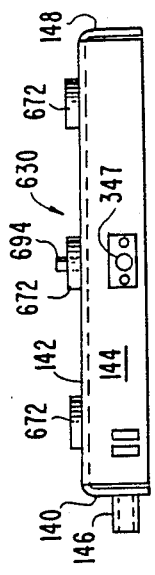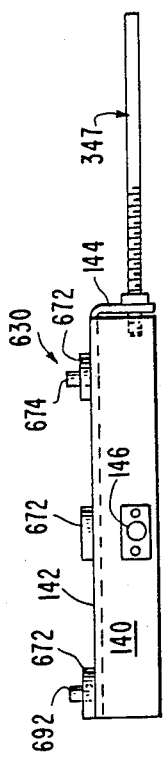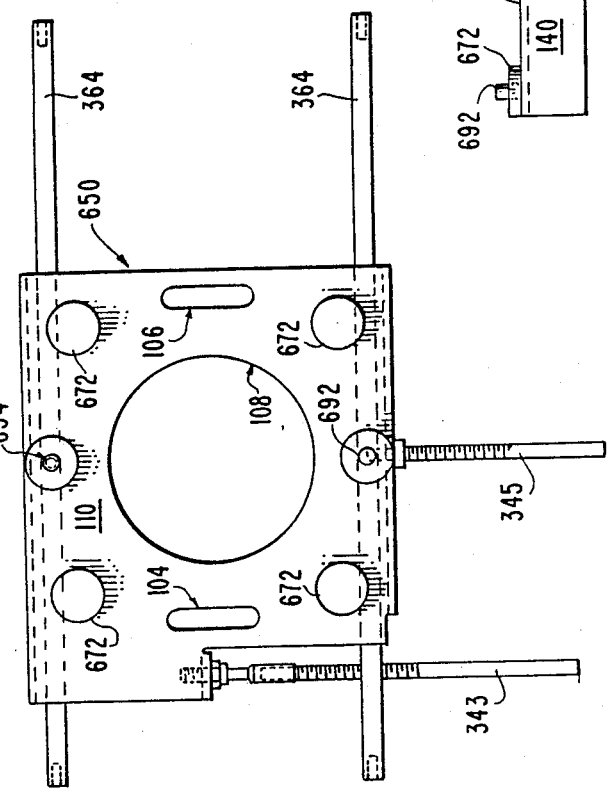

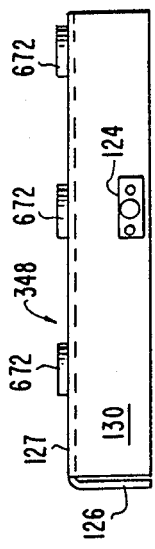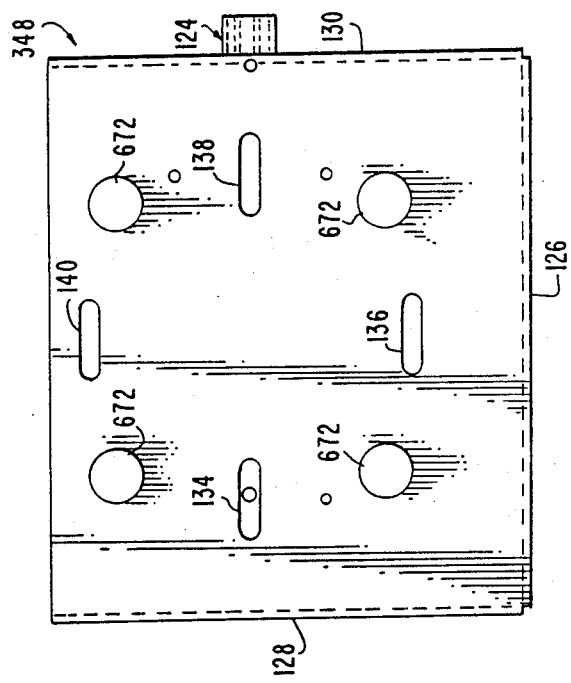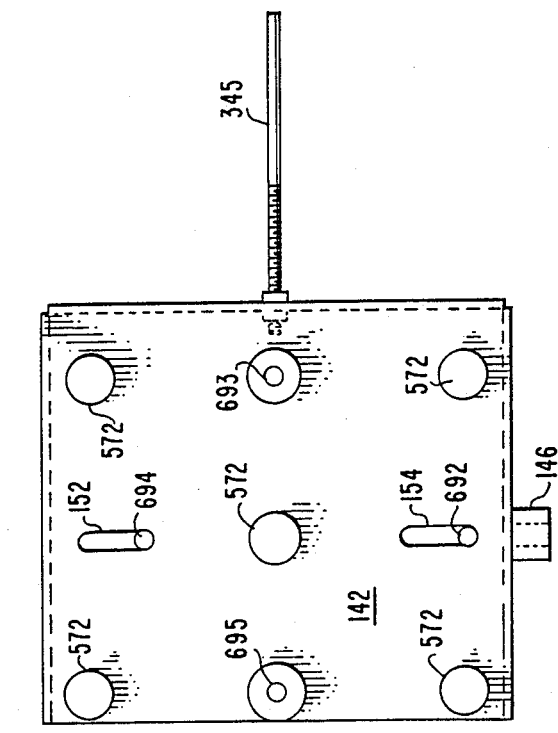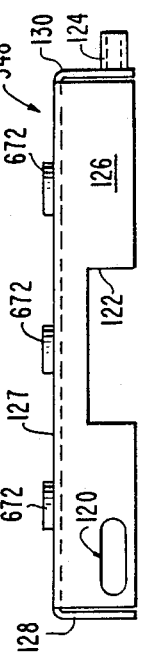

APPARATUS FOR REMOVAL AND INSTALLING ELECTRONIC COMPONENTS WITH RESPECT TO A SUBSTRATE

This is a divisional application of Ser. No. 158,724, filed Feb. 22, 1988.

RELATED PATENTS AND APPLICATIONS

This application is related to the following U.S. copending applications and patents, all of which are assigned to the assignee of the present application and all of which are incorporated herein by reference: Application Nos. 914,921 filed Oct. 3, 1986; 921,220 filed Oct. 21, 1986; 078,170 filed Feb. 27, 1987; and 092,469 filed July 15, 1987; and Pat. Nos. 4,552,300; 4,605,152; 4,659,004; 4,682,766; and 4,715,640.

BACKGROUND AND SUMMARY OF THE INVENTION

This invention relates to a method and apparatus for removing and installing surface mounted devices (SMD's) with respect to a substrate such as a printed circuit board (PCB).

One problem, especially in the field of rework and repair of PCB's, is that of aligning the leads or terminals of an SMD with respect to the lands or pads on a board where, for example, the SMD is to be installed on the board in place of a defective SMD which has previously been removed therefrom. (Of course, this problem does not arise when an SMD is being removed since it is already attached to the board.) That is, the tendency with more recent SMD's is to increase the number of leads per side where, in the future, there may be as many as 100 leads per side and where the spacing or pitch between leads may be 1 to 2 mils. At present, a spacing of 40 to 50 mils may be considered coarse spacing, a spacing of 20 to 30 mils may be considered medium, while a spacing of 10 to 15 mils may be considered fine.

Techniques are known for effecting alignment of SMD leads with respect to PCB lands, which techniques are appropriate for alignment of SMD's with coarser spacing of terminals. However, with finer spacing, more precise techniques are required and these are provided in the present invention.

Techniques are known in the mass production of PCB's and the like whereby SMD leads may be accurately aligned with respect to lands on the PCB. However, the techniques involve very precise, computer-controlled elements for effecting this alignment, which, in turn, involves substantial expense. This expense is, of course, justifiable in the mass production field; however, in the field of rework and repair, where, in many instances, an individual defective SMD is being replaced, such expense usually cannot be justified. Accordingly, it is a primary object of the invention to provide an accurate alignment capability of the above type appropriate to the field of rework and repair.

Another consideration relating to accurate alignment of SMD leads with respect to PCB lands is that of the particular type of SMD being installed. That is, SMD's may be divided into two groups depending on the type of leads employed. In the first group, the leads may be characterized as relatively rigid although there may be some flexibility. The carriers for such leads typically include (a) so-called leadless carriers where the leads are disposed in castellations formed on the sides of the carriers, the leads then extending beneath the carrier where they make contact with the lands in the PCB, (b) J-type leaded carriers where the leads have a J-type configuration and extend from the carrier side to beneath the carrier and (c) some gull-wing leaded carriers such as the Flat-Pac type where the leads extend outwardly from the carrier and terminate at some point removed from the carrier side not beneath the carrier. The foregoing lead configurations employed with integrated circuit carriers are well-known and are discussed in more detail in above-mentioned U.S. Pat. No. 4,659,004 and Application No. 092,469.

The second group of integrated circuits comprises gull-wing leaded carriers (hereafter sometimes refered to as Flat-Pac's) where the leads are substantially less rigid than those of J-type leaded carriers and leadless carriers. As indicated above, some Flat-Pac's may be included within the first group if the leads thereof are sufficiently rigid. This, to a certain degree, depends on the number of leads per side, the dimension of the leads and the concomitant spacing between the leads. That is, as the number of leads increases, the leads grow smaller in size and thus tend to become substantially less rigid. This decrease in the lead size and the spacing therebetween renders it substantially more difficult to align the leads and lands. Moreover, as discussed above, the tendency is toward even a greater number of leads per side and hence, the need for a device which can accurately align such SMD's can be appreciated.

In accordance with a primary aspect of the present invention, a viewing station is provided which is separate from the reflow station where the SMD is attached to the board. That is at the viewing station, substantially unrestricted vertical or Z-axis viewing capability is provided which may be implemented either with the aided or unaided eye (that is, with or without a microscope or a video monitor, for example). Once the SMD is aligned with the board (and semi-permanently attached thereto), it may be moved to the reflow station where the SMD is soldered to the board. Solder reflow is preferably effected by a heated air device such as those disclosed in above-mentioned U.S. Pat. Nos. 4,605,152 or 4,659,004 although other reflow devices such as those which bring a heated element into direct contact with the leads may also be used, an example of such a device being disclosed in U.S. Pat. No. 3,382,504, which is incorporated herein by reference. Other heated air devices are disclosed in U.S. Pat. Nos. 3,524,247; 4,295,596; 4,426,571; 4,444,559; 4,561,584; and 4,561,135. Alternatively, rather than moving the aligned SMD to the reflow station, the reflow station may be moved to the aligned SMD at the viewing station.

As discussed above, the first group of integrated circuits may be characterized by the relative rigidity of the leads thereof. This rigidity is helpful in attaching SMD's such as J-type leaded carriers to the board since, once alignment has occurred (with the SMD being held slightly spaced from a finely movable PCB), the J-type leaded carrier leads may then be depressed onto the respective lands with substantially no danger of the leads slipping off the lands. In this regard, it should be appreciated it is necessary to depress the leads on the lands since bottom of the leads of a J-type leaded carrier are typically not co-planar. Once depressed onto the PCB leads, the reflow station may be lowered into position to solder the J-type leaded carrier to the PCB.

Hence, in accordance with a further aspect of the invention, if attachment of SMD's belonging only to the above-discussed first group is contemplated, both the alignment and reflow functions may be effected at the reflow station where the alignment is generally effected with more accuracy than with prior art devices.

The second group of SMD's (Flat-Pac's with substantially less rigid leads) do not lend themselves to forceful depression on the lands because they tend to slip off the lands due to their lack of rigidity. Hence, in accordance with a further aspect of the invention, means are provided whereby the leads of such Flat-Pac's may be lightly positioned on the lands at the above-mentioned separate viewing station subsequent to alignment of the leads with the lands. Prior to the positioning of the leads on the lands, the lands may be cleaned and repaired (if necessary, due to the previous removal of the defective component), pretinned, and have a tacky flux applied thereto. Thus, when the SMD is positioned on the lands, it is semi-permanently held in place until it can be soldered to the board at the reflow station Hence, this capability of lightly positioning the second group of SMD's on the board at the separate viewing station is a further advantageous feature of this separate station although this capability could, with additional complexity, also be provided at the reflow station.

Flat-Pac's (with less rigid leads) are becoming increasingly popular because it is easier to align these carriers with the board lands since the leads do not terminate beneath the carriers as do the leads of leadless carriers and J-type leaded carriers. Hence, the capability by the present invention of aligning and then installing SMD's of the second group by providing a separate viewing station to effect alignment is also advantageous in that it addresses this trend toward increasing use of Flat-Pac's.

Heretofore, the alignment function described has been that of aligning SMD leads with respect to PCB lands. Not only should this alignment function being accurately effected but also alignment of the SMD with respect to the nozzle of the heater unit. That is, during reflow, as is known from aforementioned U.S. Pat. Nos. 4,605,152 and 4,659,004, the lower edge of the nozzle is slightly spaced from the PCB and the SMD is preferably coaxially disposed within the nozzle such that each side of the SMD is equally spaced from its associated wall of the nozzle.

When alignment of the SMD with respect to the PCB (as opposed to with respect to the nozzle) occurs at the reflow station, as discussed above, alignment of the SMD with respect to the nozzle is preferably effected as described in aforementioned Application No. 78,170 although other means may be employed as described in aforementioned U.S. Pat. No. 4,715,640.

In those embodiments where the alignment of the SMD occurs at a viewing station separate from the reflow station, means are provided, in accordance with the invention, to effect alignment of the SMD with respect to the nozzle after alignment of the SMD with respect to the PCB has been effected. In general, in accordance with the invention, a positionable worktable, which supports the PCB, is translated a predetermined horizontal distance between the reflow station and the viewing station where the alignment of the SMD with respect to the PCB is effected. Positionable tables of the above type are known and are described in aforementioned U.S. Pat. No. 4,682,766 and Application No. 914,921. However, the positionable table of the present invention include certain improvements with respect to the earlier tables Moreover, the capability of translating such tables a predetermined distance from the reflow station is not known and facilitates the performance of a number of functions associated with the replacement of a new SMD on a PCB. Thus, in those embodiments where the positionable table is translatable to the viewing station, the board may be so translated to the viewing station, subsequent to removal of a defective SMD, where any damage caused to the lands or board by removal of the defective SMD may be repaired The PCB may then be prepared for installation of the new component by cleaning it and applying a tacky flux which will facilitate semi-permanent attachment of the SMD once it has been aligned with the PCB lands. Moreover, the leads of the SMD and/or the lands of the PCB may be tinned at this time Next the SMD is aligned with the board, the SMD being slightly spaced from the board at this time. Next, the SMD is lightly positioned on the aligned PCB lands to ensure the leads to not slip off the lands. The so positioned SMD is then inspected to ensure alignment has been maintained. The viewing means whether they comprise the aided or unaided eye may and normally would be the same viewing means employed to effect alignment of the SMD with the board.

Next, the aligned SMD must be returned to the reflow station or the reflow station moved to the aligned SMD such that the SMD is now aligned with the reflow station nozzle. In one embodiment of the new SMD needs only to be translated back through the above-mentioned predetermined distance to the reflow station where it will be now precisely aligned with the nozzle. This is effected by accurately positioning the SMD at the viewing station prior to the alignment procedure, the new SMD being held in place while the position of the board beneath it is adjusted until alignment occurs. Thus, as stated above, the board need only be translated back through the predetermined distance to the reflow station to effect alignment of the new SMD with the nozzle.

If the new SMD is not accurately positioned at the viewing station prior to the alignment thereof with the board, means are provided in accordance with another aspect of the invention where the aligned, semi-permanently attached SMD may be re-positioned to a predetermined position such that translation of the board through the predetermined distance will result in alignment of the new SMD with the nozzle. Accordingly, a mechanical or optical reticle may be employed to define the above predetermined position on the board. By use of one of the above reticles, the position of the board with the newly aligned SMD thereon may be adjusted until the SMD is aligned with the predetermined position defined by the reticle. Once the SMD is positioned in the predetermined position, the board may again be translated back through the predetermined distance where the SMD will now be aligned with reflow station nozzle. The nozzle may now be lowered on the SMD whereby reflow may be effected to solder the SMD to the board. After the SMD has been soldered to the board, the board may again be translated to the viewing station for a final inspection to insure the SMD has been properly soldered to the board.

In the embodiments of the invention where the processed SMD's are such that it is not necessary to provide a separate viewing station for aligning the SMD with respect to the board, it is still desirable to provide the above capability of translating the board a predetermined horizontal distance from the reflow station to thereby implement many of the functions described above. In this regard, it should be noted that the direction of the predetermined horizontal distance may either be to the side of or in front of the reflow station. In the embodiment described hereafter, the direction of translation of the board is to the side of the reflow station. However, in those embodiments where a separate viewing station is not needed for alignment, the direction of translation may preferably be in front of the board.

Moreover, in the last-mentioned embodiments, alignment of the SMD with respect to the nozzle may be effected by known means as discussed above. Typically, these means include locating means disposed within the nozzle such that the SMD is manually inserted into the nozzle. Once the SMD has been inserted in the nozzle, alignment of the SMD with respect to the PCB may now be effected, in accordance with a further novel aspect of the invention, by attaching the inserted SMD to a vacuum tube which coaxially extends through the heater assembly and which is independently movable with the heater assembly such that the SMD may be lowered to and held at a substantial distance such as $1\frac{1}{2}$ inches beneath the nozzle where alignment thereof may be effected by viewing means such as the microscope of Patent Application No. 921,220 mentioned above. The above-mentioned U.S. Pat. No. 4,605,152 discloses a heater assembly which is capable of vertical movement and a vacuum tube which coaxially extends therethrough. Moreover, there is mentioned therein that the vacuum tube may be used for positioning an electronic component on a substrate. However, in actuality an alignment plate is used for the alignment function, which has not proven satisfactory in many instances. Furthermore, there is no mention in the last-mentioned patent that the vacuum tube with an SMD attached thereto may be lowered to a position substantially beneath the nozzle to facilitate alignment of the SMD with the PCB and, in particular, there is no disclosure of means in the latter patent of holding the SMD in such a lowered position.

Thus, in those embodiments where a single station is employed for both aligning the SMD with respect to the PCB and for reflow, it is still desirable to provide a separate viewing station for effecting the following functions. That is, once the defective component is removed, the board may be translated in a single movement to a separate station where any damage which occurred to the lands or the board may be repaired. Cleaning and pretinning, as required, may also be effected. The board may then be translated back to the reflow station where alignment of the SMD with respect to the PCB and then attachment thereto, in a manner to be described below, may be effected. Once the SMD has been soldered to the board, the board may again be translated to the separate station for a final inspection.

In accordance with a further aspect of the invention, alignment of the SMD with respect to the board is accomplished at the reflow station (as opposed to a separate viewing station) in the following manner. First the new SMD is inserted in the nozzle to effect alignment of the SMD with respect to the nozzle due to locator means in the nozzle as described above. Next, the above-mentioned vacuum tube is attached to the SMD and then the tube is lowered to and held at a position substantially below the heater assembly nozzle and slightly above the board whereby the position of the positioning or work table supporting the PCB is adjusted until accurate alignment of the SMD leads with respect to the PCB lands is effected typically utilizing the above-mentioned optical aids. Once alignment is effected, the vacuum tube is further lowered to press the leads against the lands and thus ensure good mechanical and eventual electrical connection between all leads and their associated lands. Next, the heater assembly including its nozzle is lowered to the PCB so that the nozzle is in reflow relation to the SMD. Reflow is next effected by delivering heated air to the nozzle to thus solder the SMD to the PCB. The vacuum tube may then be removed from the SMD and the heater assembly raised. The attached SMD may then be translated to the separate station for final inspection as discussed above.

In accordance with a further aspect of the invention, alignment of the SMD with respect to the board is accomplished at the separate viewing station (as opposed to the reflo station) in the following manner. Subsequent to the removal of a defective SMD at the reflow station, the PCB is translated a predetermined distance to the viewing station preparatory to the alignment of the new SMD with the PCB. The new SMD is inserted into a cup-shaped member, the internal configuration of which corresponds to that of the new SMD. The cup-shaped member is removably attachable to a tubular vacuum pick whereby vacuum is applied to the interior of the cup-shaped member to secure the SMD therein. The leads of the SMD extend beyond the periphery of the cup-shaped member to thus permit alignment of the leads with the lands on the PCB where substantially unobstructed vertical viewing of all four sides of the SMD is available. Different cup-shaped members may be connected to the vacuum tube depending upon the particular SMD being processed. Preferably the vacuum tube is rotatable from a first position which is in alignment with the nozzle of the heater at the reflow station to a retracted second position where the new SMD can be inserted either manually or automatically into the cup-shaped member. In automatic operation, the cup-shaped member may remove the SMD's from a chute or the like.

The first position of the vacuum tube corresponds to an aligned position with respect to the nozzle of the heater assembly, as stated above. In particular, the substrate work holder is translatable from the reflow station to a position in rather precise alignment with the first position of the vacuum tube or pick. With the new SMD inserted in the cup-shaped member, the alignment of the new SMD with the lands on the PCB may be effected by adjusting the position of the work table until alignment occurs. This is facilitated, especially when the number of leads is very large, as discussed above, by permitting substantially unobstructed vertical viewing of all four sides of the new SMD. Alignment is effected while the spacing between the new SMD and the lands on the PCB is very slight, preferably substantially less than 1/16 of an inch.

As discussed above, prior to the alignment procedure, the lands on the PCB may be cleaned and pretinned, if necessary, while the vacuum tube is in its retracted position Also, a tacky flux is applied to the lands at this time, such tacky fluxes being known and used in the above-described mass production processes.

After alignment has occurred, the new SMD is gently placed on the lands of the PCB by removal of the vacuum applied thereto or gently lowering the SMD onto the PCB lands.

Alignment of the SMD with the PCB having now been accomplished, alignment of the SMD with the nozzle of the heater assembly must now be effected. Assuming the SMD had been properly centered within the cup-shaped member, it can be assumed that the SMD will be properly aligned with the reflow nozzle when the substrate is moved back to the reflow station since means, in accordance with the invention, are provided to ensure precise movement of the worktable between the reflow station and the viewing station. Alignment of the SMD within the cup-shaped member can be sufficiently ensured by providing locating means within the cup-shaped member similar to that discussed hereinbefore within the heater assembly nozzle. If such locating means are not employed, additional means are provided, in accordance with a further aspect of the invention, to move the new SMD to a further position from which the work table can now be translated back to the reflow station nozzle with assurance that the new SMD will be aligned with the nozzle at the reflow station. Accordingly, a mechanical reticle is provided on a vertically extending portion of the vacuum tube, the reticle comprising a transparent membrane with a plurality of grid lines which correspond to the configurations of the various SMD's that may be processed with the invention. The reticle is precisely positioned on the vacuum tube so that when the new SMD is aligned with the reticle grid line corresponding to the shape thereof, the SMD will be aligned with the heater assembly nozzle when it is returned to he reflow station. Alignment of the SMD with the reticle holes is effected simply by the operator viewing the SMD through the reticle holes and positioning the work table until alignment is effected. The SMD may now be returned to the reflow station. The nozzle of the heater assembly is then lowered around the SMD to solder the SMD to the PCB in the manner described above. After the SMD has been soldered to the PCB, the heater assembly is raised and the SMD is again returned to the viewing station where all four sides thereof are inspected to ensure proper connection of the SMD to the board. It is particularly important in this final inspection that unobstructed, vertical viewing of all four sides of the component be available and, as can be appreciated from the foregoing, this is available with the present invention whether the alignment occurs either at the reflow station or at the separate viewing station.

A particular problem relating to hot air SMD removal and replacement devices of the type described in aforementioned U.S. Pat. Nos. 4,605,152 and 4,659,004 arises because PCB's with different thermal characteristics are processed by such devices. That is, due to the nature of the construction of the board (ceramic board, for example) and the presence of heat sinks, a large amount of heat may be required to raise the solder to its reflow (melting) temperature to thus permit either removal or installation of an SMD. Other boards (such as simple double-side PCB's with glass substrates) tend to drain relatively little heat and thus less heat is needed to raise the solder to its reflow temperature. Thus, in the first instance, the temperature and/or flow rate of the heated air should be greater than that in the second instance.

In certain prior art devices such as those disclosed in the foregoing patents, the temperature of the air is fixed at a level which will provide sufficient heat to effect reflow even if a board with large heat sinking capability is being processed. However, this presents a problem if a board with low heat sinking capability is being used and removal of a defective SMD is being effected. That is, normally, once the operator observes solder melt, he effects removal of the SMD by manual actuation of a vacuum pick attached to the component as described in aforementioned U.S. Pat. Nos. 4,605,152 and 4,659,004. However, if the operator delays several seconds after solder melt to remove the component, there is a danger the board will overheat thereby damaging the board and possibly adjacent good components. If the board has high heat sinking capabilities this danger is usually not significant. However, if it has low heat sinking capabilities, this danger becomes quite probable.

Accordingly, in accordance with another aspect of the invention, means are provided whereby the temperature of the hot air delivered to the SMD leads may be initially set to a value depending on the type board being processed. Thus, with a board having a lower heat sinking capability, the temperature of the hot air may be set to a lower temperature than that set for a board having a higher heat sinking capability.

As disclosed in the aforementioned U.S. patent application No. 92,469, different size and shape nozzles may be employed depending on the type of SMD being processed where the size of nozzle employed with a gull wing leaded carrier such as a Flat-Pac may be larger than that used for a leadless or J-shaped leaded carrier. Due to the different kinds of nozzles, different flow rates of the heated air by the leads to be soldered or desoldered result. Due to these different flow rates, different amounts of heat are delivered to the components leads—the faster the flow rate, the more the heat. Since the heat should be so delivered to the component leads that the solder is raised to its reflow temperature for rapid removal of the SMD while avoiding damage to the SMD or the PCB, it is desirable that the flow rate be adjustable depending upon the type nozzle employed.

In accordance with a further aspect of the invention, the flow rate of the heated air can be adjusted according to the nozzle type and board types. Moreover, due to the aforementioned capability of setting and controlling the temperature of the heated air, the temperature of the air is maintained substantially at the set temperature regardless of the foregoing adjustments of the air flow rate.

In a first, preferred embodiment of the invention, two temperature sensors are utilized in the hot air delivery device, this device generally including an upper chamber containing a heater by which flows air to be heated and a nozzle removably connected to the upper chamber for delivering the heated air to the SMD being processed, such devices being described in aforementioned U.S. Pat. Nos. 4,605,152 and 4,659,004. As will be described below, the hot air delivery device of the present invention includes a number of improvements with respect to those disclosed in the above patents. The first of the above sensors is located at the heater itself to permit idle temperature control of the heater while the second sensor is disposed in the heated air stream relatively close to the nozzle to permit more accurate control of the temperature of the air delivered to the component leads.

Aforementioned U.S. Pat. No. 4,605,152 discloses a sensor for sensing the temperature of the air passing through the heating device; however, the sensor is simply used to maintain the heater at a constant temperature. Thus, this use of the sensor is quite different from that of the second sensor the present invention whereby the temperature of the heated air is more accurately controlled.

Moreover, in accordance with a further aspect of the invention, the second sensor adjustably controls the heater temperature only during a reflow cycle during which solder melt is effected. At all other times (that is, during idle times), the heater idle temperature is controlled by the first sensor to maintain the idle temperature at a value whereby when unheated air is initially flowed by the heater during the reflow cycle, the air temperature will be quickly brought to the temperature controlled by the second sensor.

In accordance with a further aspect of the invention, spring means are provided for quickly attaching the nozzle to the heter assembly and precisely locking in place with respect to the heater assembly Moreover, the same spring means, in accordance with the invention, may be used to facilitate rotation of the nozzle for shearing a desoldered SMD from the PCB. The nozzle is then precisely returned to its aligned position with respect to the heater assembly These and other objects of the invention will be apparent from the following detailed description and the drawing.

BRIEF DESCRIPTION OF THE DRAWINGS

FIG. 1 is a perspective view of one embodiment of an apparatus according to the present invention;

FIG. 2 is a perspective view of a microscope usable with the present invention;

FIG. 12 is a top elevational view of a ceramic heater tube usable in the assembly of FIG. 5;

FIG. 13 is a longitudinal sectional view of the tube of FIG. 12;

FIG. 14 is a front elevational view of a completed assembly based upon the embodiment shown in FIG. 5 and also showing pins usable for retaining and locating a nozzle;

FIG. 17 is a side elevational view, partially in section, of a vacuum tube usable in the assembly of FIG. 5;

FIG. 18 is a sectional view taken along line 18—18 of FIG. 17;

FIG. 19 is a sectional view of a cap used in the assembly of FIG. 5;

FIG. 20 is an end elevational view of the cap of FIG. 19;

FIG. 21 is an end elevational view of a holder used in the assembly of FIG. 5;

FIG. 22 is a sectional side view of the holder of FIG. 21 taken longitudinally;

FIG. 23 is a top elevational view of a lower support member used in the assembly of FIG. 5;

FIG. 24 is a sectional view taken along line 24—24 of FIG. 23;

FIG. 25 is a sectional view taken along line 25—25 of FIG. 23;

FIG. 26 is a side elevational view of a locking pin usable in the assembly of FIG. 14;

FIG. 27 is a side elevational view of a locating pin usable in the assembly of FIG. 14;

FIG. 28 is a top elevational view of a support ring used in the assembly of FIG. 5;

FIG. 29 is a longitudinal sectional view of the ring of FIG. 28;

FIG. 30 is a top elevational view of a shear ring according to the present invention;

FIG. 31 is a side sectional view taken along line 31—31 of FIG. 30;

FIGS. 48, 49, and 50 are respectively, top, side and rear elevational views of a top rod mount usable in the present invention;

FIG. 51 is a front elevational view, partially broken away and partially in section, of a Z-travel carriage for supporting the heater assembly;

FIGS. 52A, 52B and 52C are all top elevational views, partially in section and partially broken away, of the Z-travel carriage of FIG. 51;

FIG. 53 is a side elevational view, partially in section and partially broken away, of the Z-travel carriage of FIG. 51;

FIG. 54 is a side elevational view, partially in section illustrating a holder usable with the heater assembly pick according to the present invention;

FIG. 55 is a side elevational view, partially in section illustrating an optical reticle assembly usable with the present invention;

FIG. 58 is a top elevational assembly view of parts forming and X, Y and theta workholding apparatus according to the present invention, portions of the figure which are drawn in solid outline actually being a phantom view of underlying parts;

FIGS. 64, 65 and 66 are respectively front elevational, right-hand side elevational and top elevational views of a theta adjustment plate used in the embodiment of FIG. 58;

FIGS. 67A, 67B and 67C are respectively front elevational, right-hand side elevational, and top elevational views of a plate 630 used in the embodiment of FIG. 58;

FIGS. 68A and 68B are respectively front elevational and right-hand side elevational views of the plate or member 348 of FIG. 3;

FIG. 69 is a top elevational view of the plate of FIGS. 68A and 68B; and

DETAILED DESCRIPTION OF THE INVENTION

Figure 3:
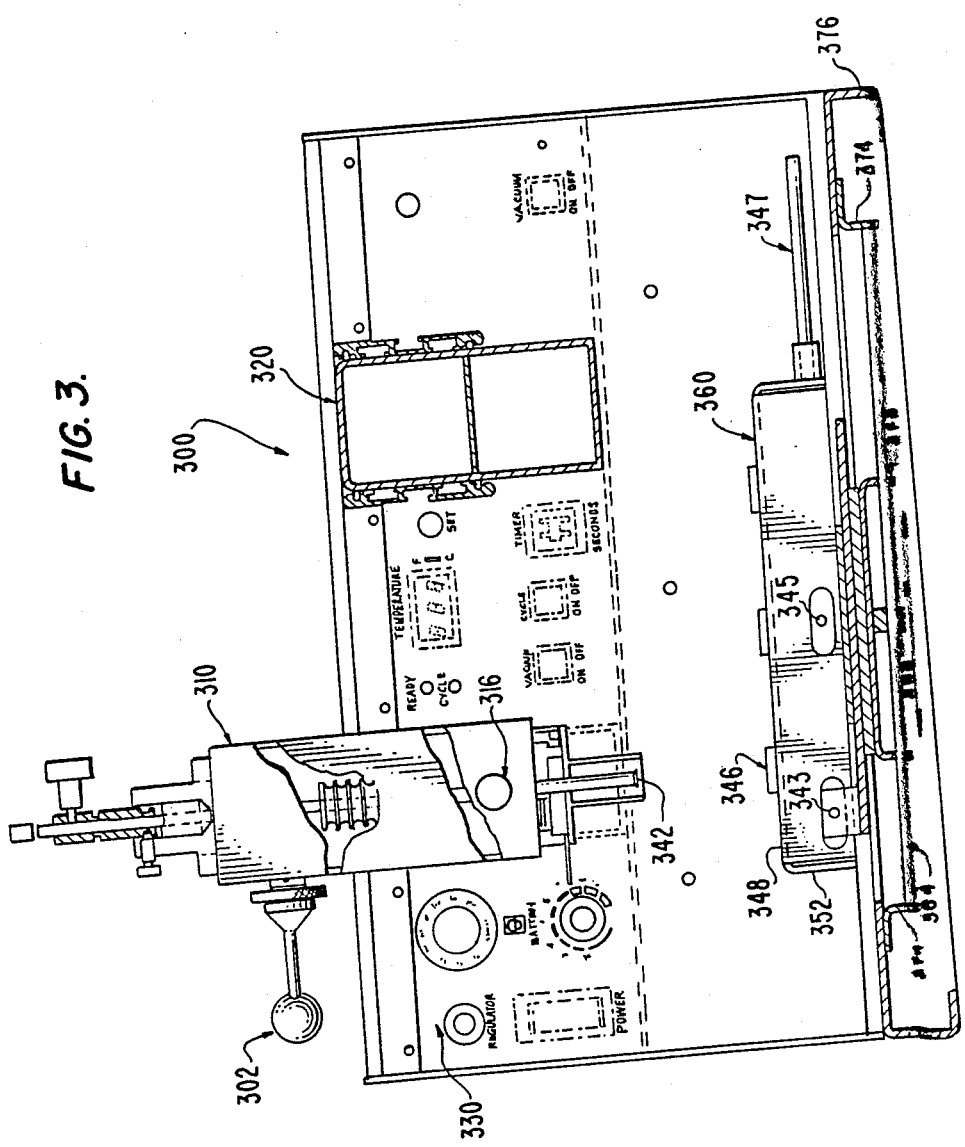
FIG. 3 is a front elevational view, partially in section and partially cut away, illustrating a moveable support and a heater assembly in accordance with the present invention.

FIG. 1 is a perspective view schematically illustrating an apparatus 300 usable in accordance with the present invention. The apparatus 300 includes a heater assembly 310, a positionable workholder 360, an inspection camera 320, and a control console 330. The workholder 360 includes a support portion which is adjustable in three different dimensions, namely, the X, Y, and theta directions. The workholder 360 as seen in FIG. 1 supports a circuit board 340 and circuit elements 350.

The console 330 controls the supply of electrical power to the heater assembly 310 for heating of air therein, and also supplies air or gas to the heater assembly 310. The heated gas is directed through a nozzle of the heater assembly 310 such that, when a circuit element 350 is positioned within the nozzle of the heater assembly 310, heated air is directed about the periphery of the element 350 for melting of solder at electrical terminals or leads.

While a camera 320 is shown, the use of same is not necessary to the practice of the present invention, and the camera 320 can be omitted in favor of visual inspections. Alternatively, a reticle assembly, not shown, can be used instead of the camera 320 for direct viewing therethrough in a downward direction by a human operator Such a reticle can be a projected image, beamed at a direction generally transverse to the line of sight downward onto the circuit board, or the reticle can be a transparent block of, for example, glass or plastic, etc.

A pick assembly 301 is shown schematically in FIG. 1, the pick being capable of moving from a dotted outline position as seen at 303' to its solid outline position directly over a predetermined, precisely-located point relative to the fixed portions of the apparatus 300 and directly centered beneath the camera (or reticle assembly, etc.) 320. This reference point is intended to be fixed in accordance with a preferred embodiment of the present invention, such that the worktable 360 can be rapidly moved, by sliding along a pair of rails, to an indexed position such that the center of the theta movement of the worktable 360 is centered vertically directly beneath the tip of the pick 303.

In use, the worktable can be moved rapidly to its indexed right-most position, where it is stopped for example by an adjustable stop member (not shown). The reference point chosen, through which the vertical center line is chosen for the tip of the pick 303, is preset so that, upon a leftward movement of the worktable 360 to a left-most indexed stop position, an aligned circuit component 350 will be concentrically aligned within the nozzle of the heater assembly 310, so as to maintain a substantially uniform gap between the nozzle and the component 350 to cause substantially uniform flow to exist about the periphery of the component 350.

A reticle, when used, can be mounted to the tip of the pick 303, or to the pick arm itself, and preferably has a pattern formed thereon which corresponds to the component 350 and which is oriented in a direction which corresponds to the orientation of the nozzle of the heater assembly 310. In operation, the pick 303 would receive a circuit component 350, for example at the station indicated in dotted outline at 303', and would be moved to an indexed position shown in solid outline at 303. The component in this position would be disposed at approximately one-sixteenth inch above the circuit board 340. The orientation of the worktable 360 would then be manually adjusted in the X direction (that is, parallel to the rails which run rightwardly under the pick 303), the Y direction (that is, in a direction orthogonal to the X direction and in the plane of the circuit board 340 in FIG. 1), and in the theta direction (that is, in a rotary direction about a Z axis, the Z axis being orthogonal to both the X and Y axes). The X, Y, and theta adjustments of the worktable are performed manually to align contact pads of the circuit board 340 with component leads of the chip 350. The viewing, taken along the Z axis looking downwardly, permits full inspection of all four sides of the component 350 to ensure proper land-to-lead contact. The contact can be maintained as by a tacky flux material which secures the component 350 to the circuit board 340 when the pick arm 303 is caused to descend downwardly under operator control (not shown in FIG. 1). The pick 301 according to a preferred embodiment holds the component by application of a vacuum to the hollow pick arm 303 which communicates with an opening in the pick tip. The vacuum thus secures the component to the pick in a relatively gentle manner. Once the component 350 is secured at a desired location on the circuit board 340, the vacuum can be cut off to the pick arm 303 to release the grip of the pick on the component. The arm 303 can then be raised under operator control and, if desired, moved back to its dotted outline position indicated at 303'.

The peripheral edges of the component are then aligned under the reticle assembly, or where the camera 320 is used, is aligned with respect to a predetermined grid or the like on a viewing screen. The pattern on the reticle, or with the grid on the television monitor, conforms in outline to a desired location of the peripheral edges of the component 350 in conformance with the particular chip orientation for location beneath the nozzle of the heater assembly 310.

The worktable 360 is then manually adjusted in the X, Y, and theta directions so that the component 350 being operated upon is substantially precisely aligned with the pattern on the reticle, or with the grid on the monitor. When proper alignment is obtained, the entire worktable 360 is slid on rails to its left-most indexed position, and the component 350 is thereby precisely disposed in a proper orientation beneath the nozzle of heater assembly 310.

The heater assembly 310 can be moved linearly in the Z direction (that is, the vertical direction). The heater assembly 310 can be raised for positioning of the worktable 360 beneath it, and can be then lowered until it is precisely spaced about the component 350 and slightly above the surface of the circuit board 340. The heater assembly 310 is then actuated to deliver heated air to cause melting of the solder at the connections between the component 350 and circuit board 340. Any number of indexed positions can be accommodated along the length of the rails if desired, and any known indexing mechanism can be used, such indexing mechanisms being in and of themselves well-known in the prior art.

FIG. 2 is a perspective view schematically illustrating a binocular magnifying assembly 370 for downward viewing. The assembly 370 can be used instead of the camera 320, to permit optical manual alignment of the component and the circuit board 340. If the assembly 370 is used, a reticle assembly can be built into the optics thereof, or can be provided separately as discussed hereinabove by a reticle assembly fixedly attached to the pick arm 303. Additionally, such a reticle assembly could be attached to the support arm for the assembly 370, and additionally, a pattern could be projected upon the circuit board from a referenced location by an optical source such as a projector or the like. All such variations are within the scope of the present invention.

In the preferred embodiment, the pick assembly 301 is fixedly aligned in the solid-outlined position shown in FIG. 1. A mechanical optical reticle assembly is, in the preferred embodiment, fixed to the arm 303 and carries at least one pattern indicating a desired optical alignment of a component 350. The reticle can, if desired, carry a family of patterns for related types of components, although such is not required in the practice of the present invention.

FIG. 3 is a front elevational view, partially broken away and partially in section, illustrating the assembly of the components according to the present invention. The heater assembly 310 has a manually-actuatable handle 302 which, upon rotation thereof, causes travel of the heater assembly 310 upwardly or downwardly within a limited range of motion. The heater assembly 310 is partially broken away to reveal interior structural details of a vacuum tube and of a heater core assembly, which are shown in greater detail in the remaining figures. The heater assembly 310 is broken away at a lower portion thereof to reveal a passageway 316 which permits passage of air or gas therethrough for heating. A vacuum tube tip 342 is seen disposed within the nozzle, the nozzle being shown in section in FIG. 3.

The mounting portion of the assembly 320, which is connected at the console 330, is shown in sectional outline. As seen, the structural support of the arm which supports the camera 320 has a rectangular structural shape. It is contemplated as being within the scope of the present invention to employ any suitable structural configuration, although the preferred embodiment is as seen in FIG. 3.

A preferred form of the worktable is seen in FIG. 3. In a preferred embodiment, a pair of rails would be attached atop the member 348, in turn atop which would be a pair of holding devices such as is shown in FIG. 1. These details have been omitted from FIG. 3 for clarity. As seen in FIG. 3, a rail pair 364 is fixedly connected to the base of the apparatus 300, to provide sliding support of the worktable 340. The direction of travel of the worktable 340 is indicated by the double-headed arrow T in FIG. 3. Adjusting arms are seen in FIG. 3, and rotation of these arms about their respective individual axes causes movement of the worktable as discussed hereinabove. Rotation of the rod 343 causes a theta adjustment of the worktable 360. The theta adjustment is an angular adjustment about the Z-axis through a relatively limited range. Rotation of the rod 345 causes adjustment of the worktable 360 in the Y direction (orthogonal to the plane containing FIG. 3), while rotation of the rod 347 causes adjustment of the table in the X direction (that is, parallel to the longitudinally-extending rod 347). The entire worktable 360 is supported as seen in FIG. 3 by a support structure which is mounted for sliding upon the rails 364. A stop member (not shown) such as a screw extending through one of the walls 374, and adjustable by rotation of the set screw, could be used as a stop member to precisely limit the extent of travel of the worktable between heater assembly 310, hereinafter sometimes referred to as the first workstation, and a rightmost workstation, hereinafter sometimes referred to as the second workstation. The stop member as described hereinabove can be provided for each of the walls 374, to provide an indexing means for precisely locating the furthermost leftward and rightward excursions of the worktable 360.

Figure 4:
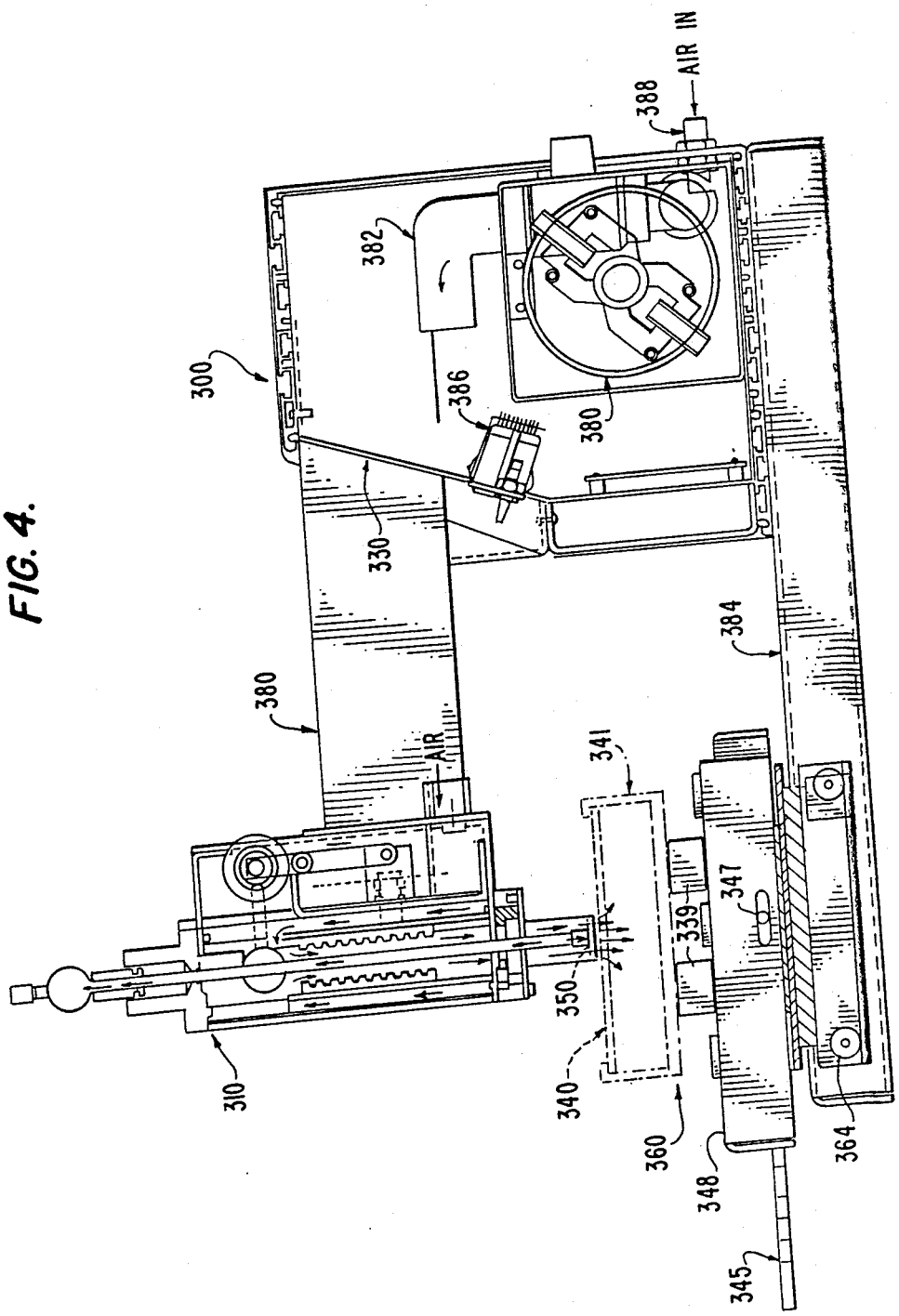
FIG. 4 is a side elevational view of the apparatus shown in FIG. 3, partially in section and partially broken away, illustrating an embodiment of the present invention and an air flow path in the heater assembly.

FIG. 4 is a side elevational view, partially broken away and partially in section, as seen from the right side of FIG. 3. Here, interior structural details of the assembly of the heater assembly 310 are seen, including the Z-travel mechanism and the interior of the heater core. The air flow path from an inlet 388 via a duct 382 which communicates with an air inlet (unnumbered) via a hose (not shown in FIG. 4) or the like. The air flows around the heater core of the heater assembly 310 upwardly, passing over the heater bobbin and then passing downwardly about the central vacuum tube and within grooves formed in the heater core. The downwardly travelling air exits through the nozzles as indicated by the arrows in FIG. 4. The nozzle is seen surrounding a component 350 n dotted outline. The circuit board 340 and circuit board holder 341 are seen in dotted outline in this figure. The rails 339, 339 support the workholder 341. The moveable worktable 360 is seen in FIG. 4, as are the rails 364 which slideably support the worktable support structure. A blower 380 is shown in FIG. 4 schematically. In a preferred embodiment a well-known type of centrifugal air blower is used. However, any type of air supply can be used, including shop air, compressed air from a tank, compressed gas, and ambient air. The control panel 330 is seen in outline in this figure. The generally flat lower surface of the apparatus 300 is indicated at surface 384. The air inlet nozzle indicated at the arrow labelled "air" corresponds to the conduit 316 shown in FIG. 3 and is as discussed hereinabove.

Figure 5:
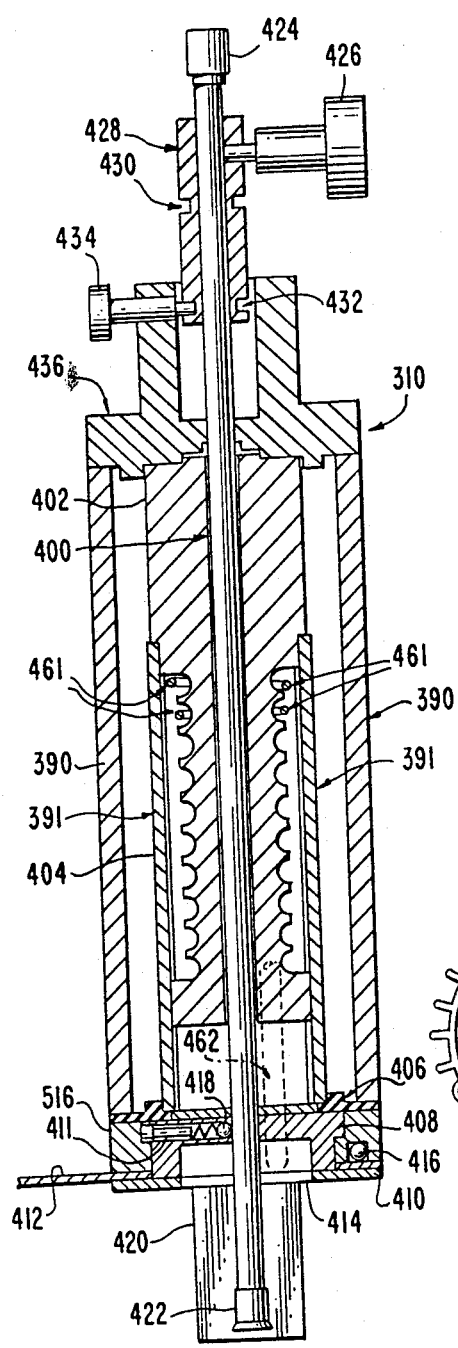
FIG. 5 is a sectional assembly view of a heater assembly according to the present invention.
Figure 11:
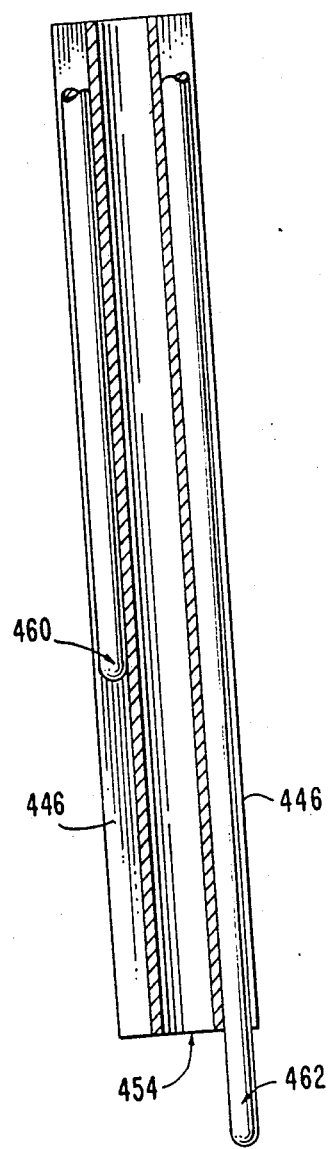
FIG. 11 is a side sectional view taken along line 11—11 of FIG. 9.

The heater assembly 310 is shown partially in section in FIG. 5. A pin 434 is supported by the cap 436, and the pin 434 selectively engages one of notches 430 and 432 in a vacuum tube holder 428. The vacuum tube holder holds a vacuum tube 400 therein by engagement of a threaded member 426 which frictionally engages the vacuum tube 400 with a wall of the holder 428. The vacuum tube 400 has a tube adapter 424 at an upper end thereof for connection with a source of vacuum (not shown). A heater core 402 is disposed between the cap 436 and a support 406. A heater tube 391 surrounds the heater core 402 at a lower portion thereof and maintains it in position against the cap 436. A thermocouple 462 is seen in dotted outline in FIG. 5 having a tip which extends in the air flow path above the nozzle base plate 414. This thermocouple is also shown in FIG. 11, discussed hereunder.

A heater extrusion 390 is coaxially disposed about the heater tube 391 and about the heater core 402. The heater extrusion 390 is fixed between the cap 436 and the support 406, and is fixedly connected thereto as by welding, gluing, ultrasonic welding, fastening and the like.

Similarly, an outer support ring is fixedly connected to the support 406, by riveting, welding, or any other known manner of fixed attachment. The outer ring 516 has a step thereon at an interior portion thereof to rotatably receive a lower support member 408. The lower support 408 has a threaded bore therein which receives a screw 414 and a ball 418. Tension on the ball 418 is provided by a spring (unnumbered) by tightening or loosening of the screw 414. The tip of the ball 418 engages a groove shown in FIG. 16) in the vacuum tube 400 to cause the vacuum tube 400 to rotate together with the lower support 408. The lower support 408 is fixedly connected to a shear ring 412. The shear ring has a handle for manual actuation of the lower support 408. The nozzle holder is fixedly connected to a locating plate 410. The locating plate 410 has a small clearance away from the support ring 516, so that the locating plate can readily rotate with the shear ring 412. The locating plate 410 can retain a nozzle base 414 by use of locking pins and locating pins as described herein under (not shown in this figure). The nozzle base 414 is fixedly connected to a nozzle 420 by bracket members or the like (not shown in FIG. 5). The vacuum tube 400 has a tip 422. This tip can be of any desired shape, and is used for removing molten solder or the like as is known in the art. A ball 416 is seen in FIG. 5 disposed within a passageway formed within the support ring 516. This ball permits adjustment, as discussed hereunder, of the angular travel of the shear ring 412 upon manual actuation thereof.

Figure 6:
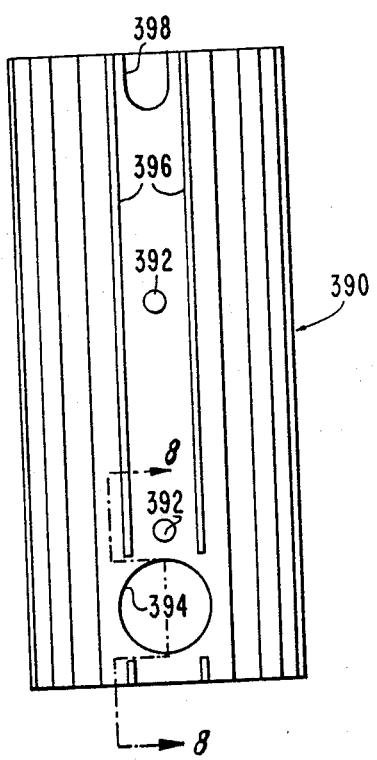
FIG. 6 is a rear elevational view of a heater extrusion tube.

FIG. 6 is a rear elevational view of a heater extrusion tube 390 according to the present invention, showing an air inlet opening 394 and mounting holes 392. A pair of raised support fins 396 are provided for contacting a support arm when the heater extrusion 390 is mounted thereto.

Figure 7:
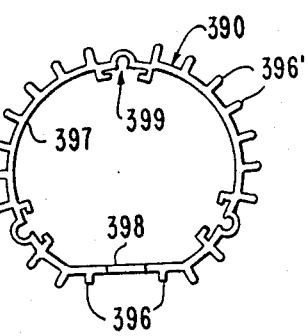
FIG. 7 is a top elevational view of the tube of FIG. 6.

FIG. 7 is a top elevational view of the heater extrusion tube 390, showing the mounting fins 396, 396 as well as a plurality of cooling fins 396'. Three interior projecting pairs 399 are also shown in FIG. 7.

Figure 8:
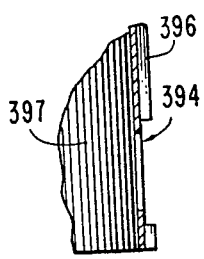
FIG. 8 is a side sectional view taken along line 8—8 of FIG. 6.
Figure 9:
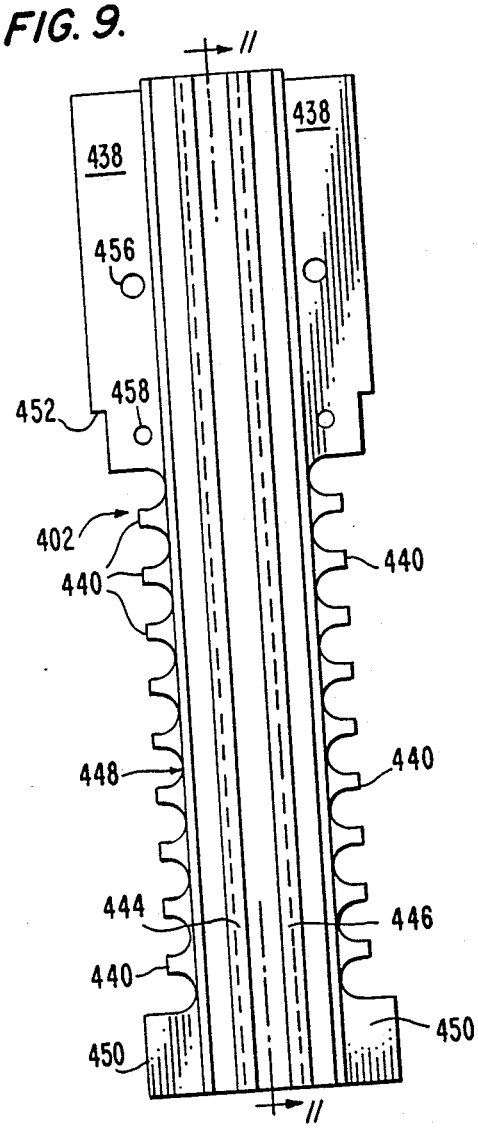
FIG. 9 is a front elevational view of a heater core usable with the heater assembly of FIG. 5.

FIG. 8 is sectional view, partially broken away, taken along line 8—8 of FIG. 6. The interior wall 397 of the extrusion tube 390 is seen in this figure FIG. 9 is a front elevational view of the heater core 402. The heater core includes a pair of flange portions 438 which define shoulders 452 for receiving the edge of the heater tube 391. A plurality of holes 456, 458 are located in the heater core 402 for passage of electrical conductors therethrough. The heater core 402 has a pair of flanges 450 at a lower end thereof, which are snugly received within the heater tube 391. A plurality of teeth 440 are disposed on opposite side flanges, and are for receiving a heater coil 461 of electrical resistive wires for generating heat in the heater core. The regions 448 between adjacent teeth 440 are concave and are preferably semi-circular.

Figure 10:
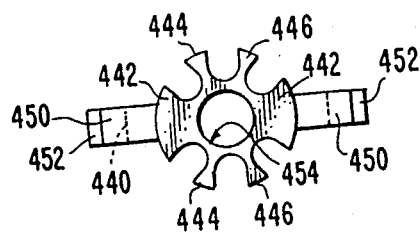
FIG. 10 is a bottom elevational view of the heater core of FIG. 9.

FIG. 10 is a lower elevational view of the heater core 402 of FIG. 9. The heater core 402 has a hollow interior opening 454 for receiving the vacuum tube 400 therethrough. Grooves (unnumbered) are formed between adjacent ones of extensions 442, 444, and 446 as seen in FIG. 10. These grooves serve to facilitate passage of air therealong and to receive thermocouple elements therein FIG. 11 is a side sectional view taken along line 11—11 of FIG. 9, and shows the disposition of a pair of thermocouples 460 and 462 in grooves 446, 446. Thermocouple 460 is for sensing the heater core temperature itself. Thermocouple 462 extends from the heater core body and into the air stream so that it senses air stream temperature. The use of these two thermocouples are described hereunder with reference to the electrical control circuits employed in the present invention.

FIG. 12 is a top elevational view of the ceramic heater tube 391, having a wall 404. The wall 404 has notches 464 therein.

FIG. 13 is a sectional view taken along the center line of FIG. 12, and omits the view of the notches 464. As seen in FIG. 13, the tube 404 is of an insulative material, and serves as a heat barrier to retain the heat of the heater core 402. The heater tube 404 also serves as an electrical barrier. It is noted that it is preferred that the heater core 402 itself be composed of non-conductive material to minimize the possibility of electrical shorting and to reduce thermal conduction from the heater core to the adjacent housing parts.

FIG. 14 is a front elevational view of the assembled heater assembly 310. The heater assembly 310 has a plurality of pins 466, 468 and 470. The pins 466 and 468 are locking pins which serve to selectively retain a nozzle base in position against the bottom end of the heater assembly 310. The pin 470 is a locating pin, which acts in corporation with another locating pin 474, to secure the nozzle base to the heater assembly 310 by operation of the shear handle 412.

Figure 15:
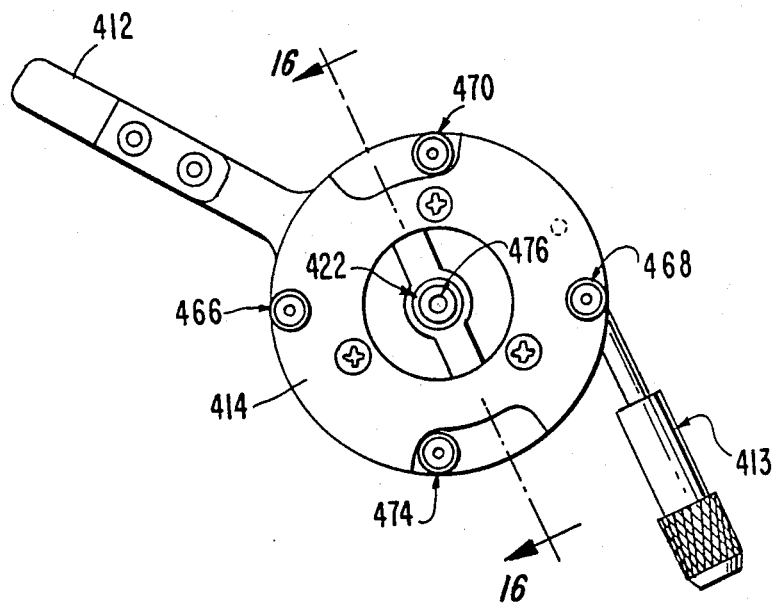
FIG. 15 is a bottom elevational view of the heater assembly of FIG. 14.

FIG. 15 is a bottom elevational view of the heater assembly 310 of FIG. 14. Here, the locating pins 470 and 474 are clearly seen, together with the other assembled components. Rotation of the shear ring 412 is through its prescribed range of movement causes relative travel of the plate and the pins 470 and 474. The plate 414 has a pair of indentations therein on opposite sides thereof, for receiving the pins 470 and 474. The pins 464 and 465 are received within shallower indentations in the plate 414, such that, upon rotation of the shear ring 412, the pins 466 and 468 move relative to the indentations and rigidly secure the plate 414 therebetween. An adjusting screw 413 is shown in FIG. 15, and is for adjusting the range of travel of the shear handle 412 during turning of the nozzle itself to break an electronic component free from a circuit board when the component is engaged in the nozzle 420.

Figure 16:
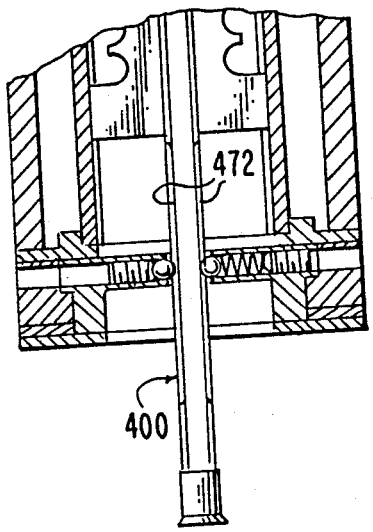
FIG. 16 is a sectional view taken along line 16—16 of FIG. 15.

FIG. 16 is a sectional view taken along line 16—16 of FIG. 15. In this view there is clearly shown the engagement of the spring-loaded balls in slots 472, 472 disposed on opposite sides of the vacuum tube 400. The slots 472 permit a vertical relative range of movement of the vacuum tube relative to the balls disposed in the slot. This permits the vacuum tube 400 to be extended downwardly, or to be raised into a relatively retracted position, during use. The length of the slots is at least as great as the distance between adjacent notches 430 and 432 in the holder 428, since this range of motion is the minimum range contemplated in the use of the present invention. The longer slot length of slots 472 is within the scope of the present invention, and would provide an additional range of motion of the vacuum tube 400 relative to the nozzle 420 and relative to the heater core 402.

FIG. 17 is a side view of the vacuum tube 400, shown partially in section. Here, the slot 472 is seen in true width.

FIG. 18 is a sectional view taken along line 18—18 of FIG. 17. It is seen that the notch 472 does not extend through the wall of the vacuum tube 400. The groove 472 is defined by walls which intersect at a generally ninety degree angle.

FIG. 19 is a sectional view of the cap 436. The cap 436 has a raised ridge 510, an annular surface 508, a bore 504, a large interior cylindrical side wall 506, a conically tapering wall portion 512 and an innermost opening 514.

FIG. 20 is an elevational view of the cap 436 of FIG. 19 as seen from the left of that figure. Here, the disposition of the bore 504 is seen.

FIG. 21 is an end elevational view of the holder 428. The holder 528 has an interior cylindrical wall 478 and at least one bore 480 therethrough for receiving a screw therein in threaded engagement. The screw, when inserted in the threaded bore 480, can be tightened until it retains the vacuum tube 400 therein by frictional engagement.

FIG. 22 is a sectional side view of the holder 428, showing the threaded bore 480, and grooves 430 and 432.

FIG. 23 is a top elevational view of the lower support 408 showing in dotted outline a bore therethrough for receiving a set screw and spring-biased ball (as seen in FIG. 5) for engagement with the groove 472 of the vacuum tube 400. Thus, the vacuum tube 400 must rotate with the lower support 408, so that turning of the shear ring 412, which is fixedly connected with the lower support 408, will in turn cause rotation of the nozzle 420 and the tip 422, thereby avoiding the possibility of disturbing the correct orientation of the component relative to the nozzle 420 during operation of the shear ring 412. The lower support 408 has an upper surface 417 and a pair of bridging arms 419.

FIG. 24 is a sectional view of the lower support 408 as taken along line 24—24 of FIG. 23. Here, the bore 413 can be seen in true outline. A second bore 413 can be provided, as suggested by FIG. 16 discussed hereinabove, although this is not necessary in the present invention. The lower support 408 has an annular raised ridge 409, a rear surface 419, and an interior cylindrical surface 4Il Central opening 415 is seen in FIG. 24.

FIG. 25 is a sectional view of the lower support 408 as taken along line 25—25 of FIG. 23. Here, a bore 413 is seen. The bore 413 is one of four bores which are equi-angularly spaced and are sized to receive connecting pins in an interference fit therein, for connecting the lower support 409 to the locating plate 410. Other means of fixedly connecting numbers 408 and 410 fixedly are contemplated as being within the scope of the present invention.

FIG. 26 is a side elevational view of a locking pin 466 in accordance with the present invention.

FIG. 27 is a perspective view of a locating pin 470 in accordance with the present invention.

FIG. 28 is an elevational view of the support ring 406 of the present invention. The support ring has a plurality of bores therein for securing the support 406 to the heater tube 391 and to the outer support ring 516.

FIG. 29 is a sectional side view of the support ring 406, showing the annular surface 488, an outer annular surface 484, an interior annular ledge 490, and the interior wall 492.

FIG. 30 is a top elevational view of the shear ring 412 according to the present invention. The shear ring 412 has a handle 502 and an elongated clearance slot 498 to permit passage of a pin therethrough. The slot 498 permits relative travel between the shear ring 412 and the pin which is fixed to the locating plate. The pin fixed for rotation with the locating plate 410 and is received by a corresponding slot within the outer support ring 516. A pair of bores 495 are seen in FIG. 30 and can be employed for insertion of pins to fixedly connect the shear ring 412 with the locating plate 410. Other engagement means can also be used within the scope of the present invention to secure these members together. A slot 494 seen in FIG. 30 is an additional clearance slot which is not used in this embodiment.

FIG. 31 is a side sectional view of the shear ring 412 as taken along line 31—31 of FIG. 30.

Figure 32:
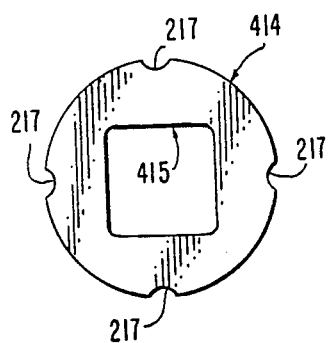
FIG. 32 is a bottom elevational view of a nozzle base plate used in the embodiment of FIG. 5.

FIG. 32 is a rear elevational view of a nozzle base plate 444 having an interior opening 415.

Figure 33:
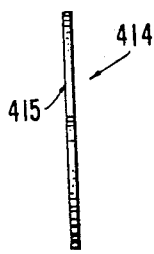
FIG. 33 is a side sectional view of the plate of FIG. 32.

FIG. 33 is a side view in section of FIG. 32.

Figure 34:
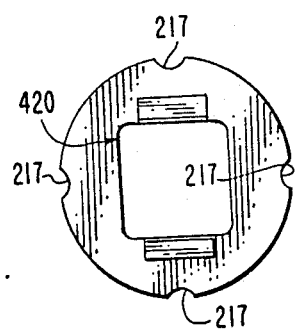
FIG. 34 is a bottom elevational view of a nozzle base plate having a nozzle attached thereto.

FIG. 34 is a front elevational view of a nozzle base plate 414 having a nozzle 420 attached thereto by a pair of brackets (unnumbered) shown schematically above and below the nozzle in FIG. 34.

Figure 35:
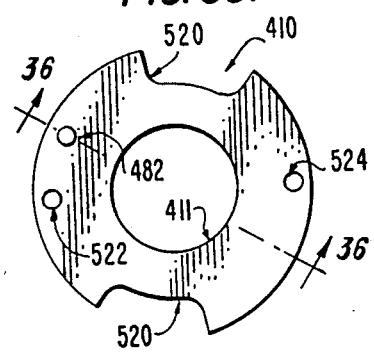
FIG. 35 is a top elevational view of a locating plate used in the embodiment of FIG. 5.

FIG. 35 is a top elevational view of a locating plate in accordance with the present invention. The locating plate 410 has a pair of oppositely-disposed recesses 520 therein and a pin 482. The pin 482 is fitted within the plate 410 by an interference fit or the like, such as by a threaded engagement, welding, and so on. The locating plate 410 has an interior opening 411. The locating plate 410 receives the locating pins in the recesses 520, and receives the stems of the locking pins within the bores 522 and 524.

Figure 36:
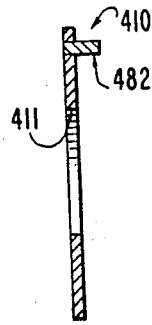
FIG. 36 is a side sectional view taken along line 36-36 of FIG. 35.

FIG. 36 is a side sectional view taken along line 36—36 of FIG. 35. FIG. 36 shows the projection of pin 482. The locking pins are fixedly disposed on the shear ring 412, whereas the locating pins are fixedly connected to the locating plate 410. Thus, the locking pins can move within the slots 520 of the locating plate 410 up until the point where the pin 482 engages with the support ring 516. Thus, rotation of the shear ring about the Z-axis results in movement of the locating pins relative to the slots 520, causing the locking pins to move out of the notches formed in the nozzle base 414 (as seen in FIGS. 32 and 34) and to thereby tightly receive the nozzle base 414.

Figure 37:
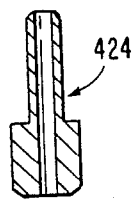
FIG. 37 is a side sectional view of a vacuum tube adaptor used in the embodiment of FIG. 5.

FIG. 37 is a side sectional view of the vacuum tube adaptor 422. It is used for connection of the vacuum tube to a conduit or other connector.

Figure 38:
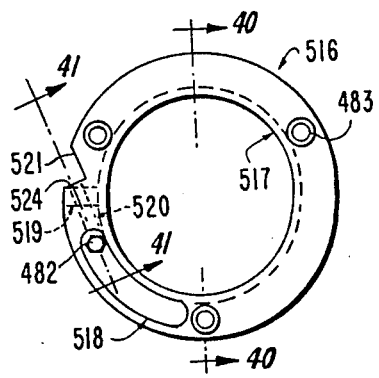
FIG. 38 is a top elevational view of an outer supporting ring used in the embodiment of FIG. 5.

FIG. 38 is a top elevational view of the outer supporting ring 516. The outer supporting ring has a notch formed by wall 521 and 524. A slot 518 is formed through the outer support ring 516 as indicated in FIG. 38, the slot 518 being adapted for receiving a pin 482. Pin 482 is shown in FIG. 38 to schematically illustrate the relationship of the components. A plurality of pins 483 are provided for attachment of the outer support ring 516 to the support 406. A passageway 520 connects the wall 524 with the slot 518. The outer support ring 516 has an interior cylindrical wall 517. The ring 516 also has a bore 519 extending from the exterior surface through the interior.

Figure 39:
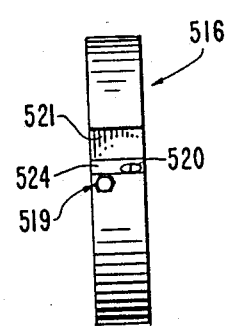
FIG. 39 is a left-hand side elevational view of the supporting ring of FIG. 38.

FIG. 39 is a lefthand side elevational view of the ring 516 of FIG. 38. Here, the opening for the bore 520 appears elliptical, and the opening for bore 519 is seen in true view.

Figure 40:
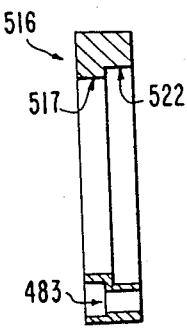
FIG. 40 is a sectional view taken along line 40—40 of FIG. 38.

FIG. 40 is a side sectional view taken along line 40—40 of FIG. 38, and shows an interior cylindrical surface 522 in addition to the interior cylindrical surface 517 previously illustrated.

Figure 41:
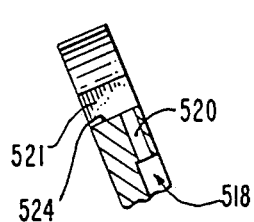
FIG. 41 is a sectional view taken along line 41—41 of FIG. 38.

FIG. 41 is a partial side sectional view taken along line 41—41 of FIG. 38. Here, the bore 520 is seen in true view connecting with the slot 518. As seen in FIG. 41, the slot 518 is formed in one side of the ring 516 and does not extend completely through the ring 516.

Figure 42:
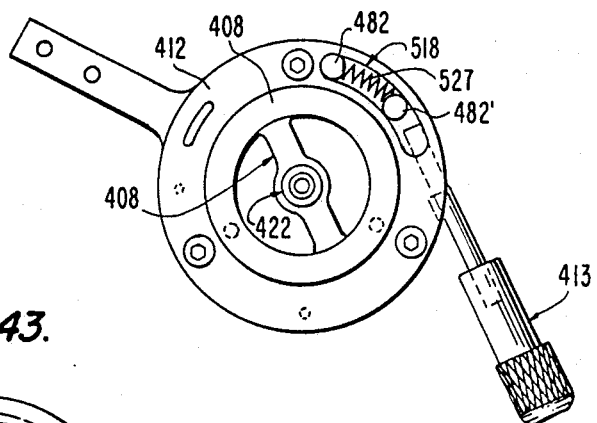
FIG. 42 is a bottom elevational assembly view of the outer supporting ring assembled together with the shear ring and other components.

FIG. 42 is a bottom elevational assembly view of the ring 516 assembled together with the shear ring 412 and with other components as illustrated. As seen in FIG. 42, movement of the shear ring clockwise would result in compression of a spring 527 and movement of the pin 482 from the position shown to that of 482'. Movement of the shear ring 412 counterclockwise would result in movement of the locating pins relative to the nozzle assembly (not shown in this Figure). The adjustable set screw 413 is seen penetrating through the bore 520 and into a position to determine a limit of travel for the pin 482. Threaded engagement of the set screw 413 into or out of the bore 520 results in some adjustment of the furthermost excursion of the pin 482 within the slot 518. Preferably, the spring 527 is disposed between a distal end of the setscrew 413 and the pin 482 so as the pin 482 moves within a predetermined distance from the distal end of the set screw 413, the spring resistance gradually increases, with the spring force generating a return action of the shear ring 412 due to its engagement with the pin 482.

Figure 43:
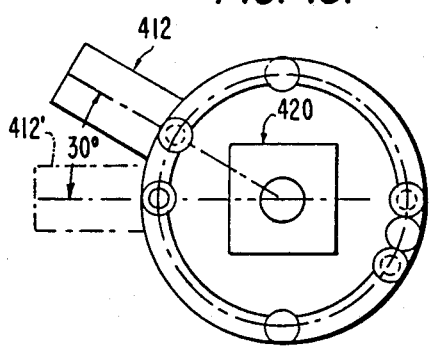
FIG. 43 is a bottom elevational view of the heater assembly of FIG. 14 showing travel of the shear ring.

FIG. 43 is a bottom elevational view of the assembled components showing the travel of the shear ring 412 from its original position to the dotted-outline position 412'. As seen in FIGS. 35 and 43, a thirty-degree excursion of the shear ring 42 relative to locating plate 410 is permitted in this embodiment. This is due to the length of the recesses 520, 520 of the locating plate 410, which limits the travel of the pins 435 of the shear ring 412 therein. The locating pins 470, carried by the fixed locating plate 410, remain stationary during movement of the shear ring, such that the locking pins 466 carried by the shear plate 412 are urged past the notches 217 in the work base plate 414, thereby locking the plate 414 in an interference fit therebetween. At the limit of the excursion of the pins 435 in the slots 520, further movement of the shear ring 412 causes movement of the plate 410 and thus causes movement of the pin 482 in the slot 518 of the ring 516. The travel of the locking pins 466, 466 is also seen in FIG. 43 by the dotted outline positions.

Figure 44:
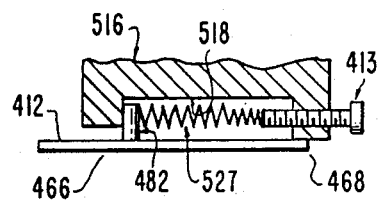
FIG. 44 is a schematic side sectional view illustrating an operating principle of the heater assembly.

FIG. 44 schematically illustrates the operating principal of the return spring 527 which is disposed between the pin 482 of the shear ring 412 and the end of the slot 518.

Figure 45:
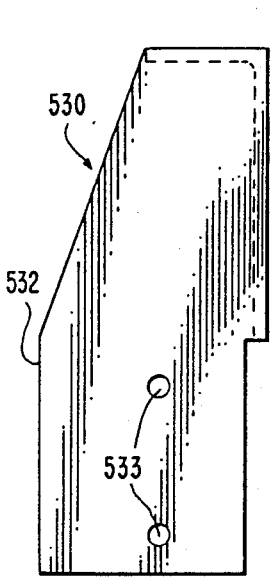
FIGS. 45, 46, and 47 are respectively, side, top, and bottom elevational views of an arm support usable in the present invention.
Figure 46:
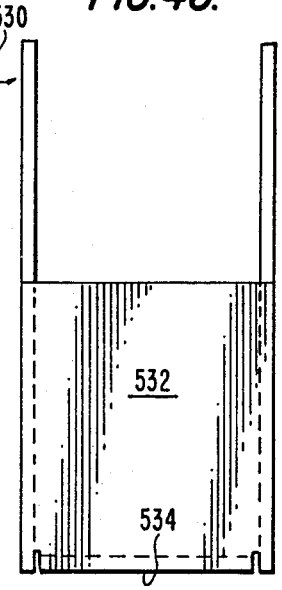
Figure 47:
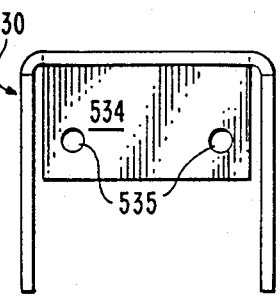

FIGS. 45, 46, and 47 are respectively side, top, and bottom elevational views of an arm support 530 usable with the present invention. The arm support 530 has a front wall 532, mounting holes 533 and 535, and a bottom mounting wall 534.

FIGS. 48, 49, and 50 respectively illustrate top, side, and rear elevational views of a top rod mount 538 usable in the present invention. The mount 538 has a rear wall 540, a top wall 542, and holes 539, 541, and 543.

FIGS. 51, 52A, 52B, 52C, and 53 are respectively front, top, and side elevational views of the Z-travel carriage, mount, and control mechanism shown in assembled view. Here, the manual release lever 302 is spring biased by a spring 600 within a brake assembly 590. Movement of the arm 302 in a clockwise direction as seen in FIG. 52 results in movement of the brake assembly 590 away from a friction pad 602 which is in the shape of a washer. This release permits rotation of the arm 302.

A housing 560 is mounted to the support arm. The housing 560 has an upper wall formed by member 538 which is fixedly attached to the housing 560 by screws or the like. The housing 560 can correspond if desired to the embodiment shown in FIGS. 45-47 as housing member 530. Here, the bottom wall will be wall 534 as seen in FIG. 47, for mounting the lower end of the guide rods 574. A pair of guide rods 574, 574 are mounted in parallel spaced relationship so that a Z-travel carriage 546 can slide thereon, the carriage 546 being mounted by nylon bearings 576 as seen in the figures. A conduit 578 extends through the rear wall of the Z-travel carriage 546 for connection to a flexible conduit which is a source of gas or air as described hereinabove. A pair of mounting holes 579, 579 are provided for attachment of the heater assembly 310 thereto via corresponding mounting holes 392, 392 formed in the housing 390 (as seen in FIGS. 6-8).

Rotation of the brake mechanism 590 drives a link 596 in rotation about the axis of the brake assembly 590 due to connection of a pin 607 within a rotatably mounted yoke member 606. The yoke has a base 599. The spring 600 urges the tip 604 of the arm 302 against a member 605. The rotation of the link 596 causes raising and lowering of the carriage 546 via the raising and lowering of the link 598, which is pinned at either end to permit the carriage to follow the rotation of the crank arm 596 in a known type of mechanical movement which is referred to as a crank and slider mechanism.

As seen in FIGS. 52A, 52B, and 52C, the lever 302 is pivotable about pivot point 607 to the spring bias by spring 600 into engagement with a pin 603. The pin 603 extends outwardly beyond the radial extent of the drive shaft 599 to engage the friction washer 602. The friction washer 602 can be formed of rubber or other material suitable for this use. By movement of the lever arm 302 in the direction indicated by the arrow L in FIG. 52B, the lever can be moved from the locked position to an unlocked position shown in FIG. 52C. Movement of the lever releases the relatively strong spring force which had been transmitted via the lever tip 604 to the pin 603 and thence to the friction washer 602 to strongly frictionally engage the support surface 560, thereby acting as a break or lock mechanism to retain the hub 590 in any desired rotary position.

FIG. 54 illustrates a cup-shaped member 608 attached to the pick arm 303. The member 608 is preferably sized to snugly and precisely receive an electrical component thereon, to locate the component 350 is a predetermined orientation as discussed above, thereby serving as a mechanical reticle. The component 350 is received such that its electrical leads 351 extend outwardly beneath the member 608. The member 608 is preferably interchangeably mounted, as discussed hereunder, to enable use of any one of a family of cup-shaped members 608, each of differing sizes or proportions, to fit differing types of electrical components.

FIG. 55 illustrates an optical reticle assembly fixed to the arm 303. In both the case of the member 608 and the reticle 610, these are removably attached to the vertically extending portion of the arm 303 and are preferably precisely located thereon by a releasable key mechanism, or as by a spline, etc. Any type of precision connection can also be used in the present invention, and it is also contemplated as being within the scope of the present invention to provide for a permanently fixed connection between the arm 303 and the cup-shaped member 608, or between the arm 303 and the reticle 610, the keys being indicated by numeral 609 in these figures, and such a key being suggested in dotted outline in these figures.

Figure 56:
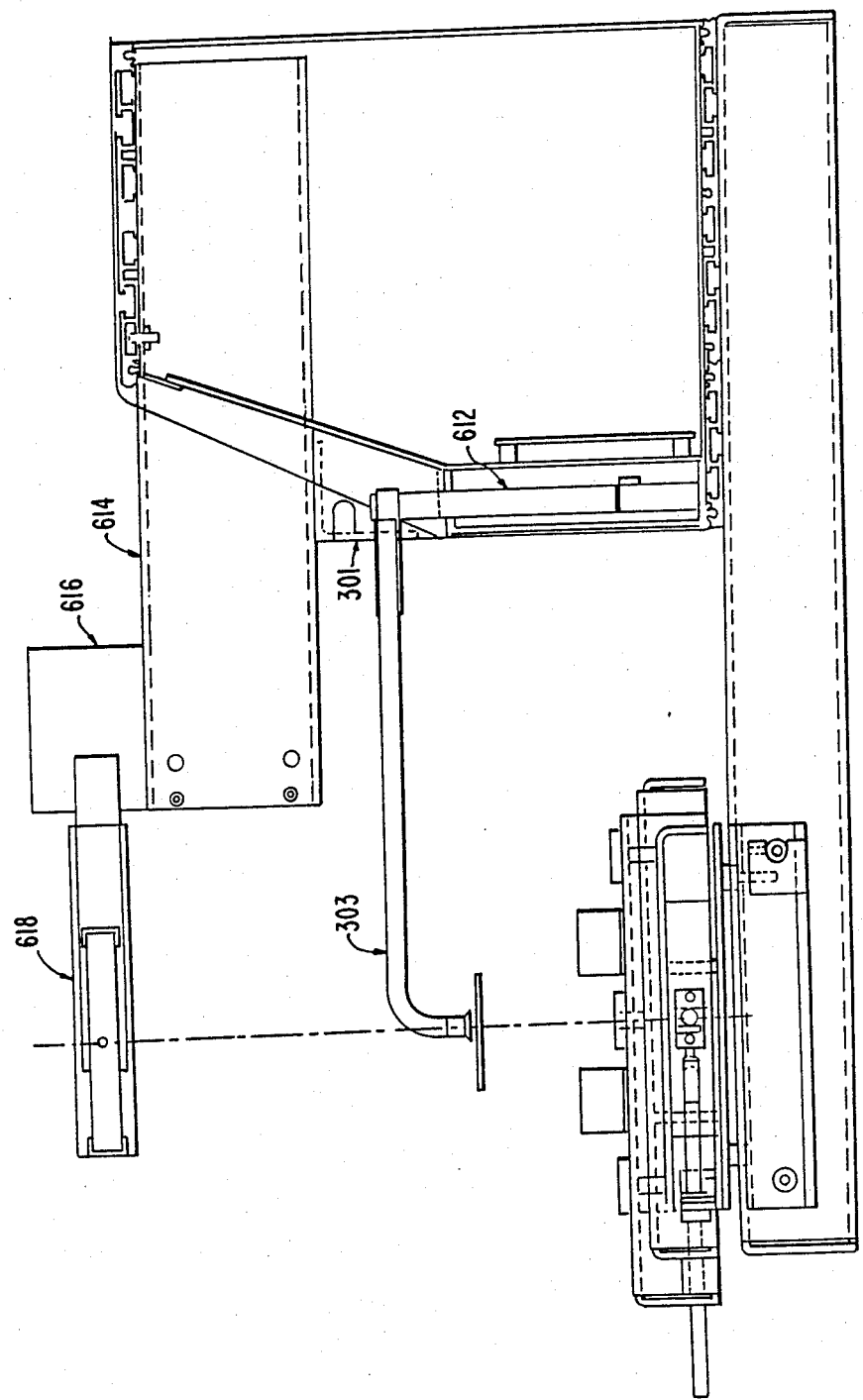
FIG. 56 is a side elevational view, partially in section, illustrating mounting of a pick arm used at a location other than the heater assembly location.

FIG. 56 is a side elevational view, partially in section, of the mounting of the pick arm 303 and of the mechanism 301. As seen in FIG. 56, a column 612 rotatably supports the pick 303 in one embodiment. Bonded directly over the pick is a support arm 614 having a support block 616 mounted atop it. The block 616 supports an optical reticle assembly 618 which can be used in conjunction with a microscope or television camera mounted above the reticle 618.

Figure 57:
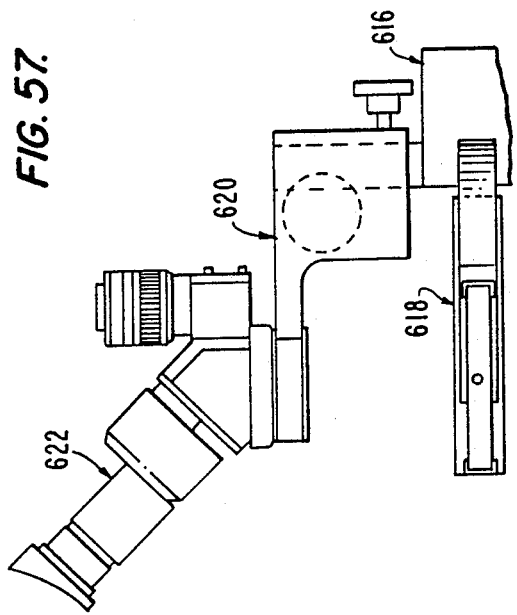
FIG. 57 illustrates schematically the positioning of an optical microscope and a reticle assembly.

FIG. 57 illustrates schematically the positioning of an optical microscope 622 mounted by a mounting member 620 atop the block 616. As can be seen, the microscope 622 is positioned in overlying relationship with the reticle 618.

FIG. 58 is a top elevational view of an assembly of parts forming the X, Y, theta work holding apparatus 360. Here, the overlying plate 348 is disposed in sliding contact atop underlying plate 630. Actuating arm 347 controls the X-translation of the plate 348 relative to the plate 630. This is accomplished by provision of threading on the arm 347 which engages a nut which is attached to the plate 348, a distal end of the arm 347 being rotatably mounted in the plate 630.

The plate 630 rests atop plate 650 in sliding engagement therewith. The sliding engagement between adjacent plates is provided by provision of a plurality of spaced pads which are fixed between adjacent plates to permit smooth sliding therebetween. The arm 345 is threadedly engaged with a nut which is fixedly connected to the plate 650, a distal end of the rod 345 being rotatably mounted to the plate 650.

The plate 650 rests atop a ring 624. The ring 624 in turn rests atop an underlying plate 680, the plate 680 having an upwardly projecting portion which rotatably receives a distal end of the rod 343 at a ball joint which permits angular relative movement between the rod 343 and the support plate 680. The rod 343 is threadedly engaged with a socket connected to the ball joint, so that rotation of the rod 343 results in a relatively small angular translation of the support table 680 about a central fixed pivot point which is centered within the ring 624. Thus, the ring 624 rotates about its center point under action of the rod 343. This small angular displacement is commonly referred to as a "theta tweak".

Figure 59:
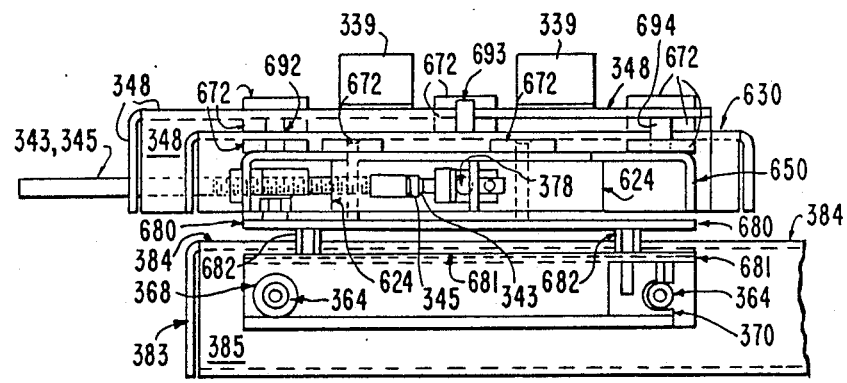
FIG. 59 is a right-hand side elevational view, of the apparatus of FIG. 58, shown partially in section, portions of the figure which are drawn in solid outline actually being a phantom view of underlying parts.

FIG. 59 is a side elevational view of the apparatus shown in FIG. 58, as seen from the right hand side thereof. A pair of rails 339, 339 are supported on the work table surface 348, as shown in the foregoing. Spacer pads 672 are seen at a number of locations between the plates in FIG. 59, to permit sliding movement of the respective plates 348, 630, and 650 relative to one another and to an underlying support ring 624. The ring 624 rests upon a support plate 680 which in turn is secured by support members 682, 682 to the translatable carriage 681. Carriage 681 has a pair of nylon bearings 368 which extend about one of the guide rods 364. The travelling carriage 681 has a guide block 370 which contains an open-ended slot for receiving the other one of the guide rods 364. This arrangement permits a relatively precise linear travel of the carriage 681 and reduces any additional friction or stresses which would otherwise occur if the block 370 tightly fit against the respective guide rod 364 due to very slight differences in spacing, uniformity, and parallelism between the guide rods 364, 364. Thus, the leftmost guide rod 364 as seen in FIG. 59, if sufficiently precisely formed, is in effect the main guide means since the other guide rod, if sufficiently level, will support any travel of the other, rightmost guide rod 364 therein.

FIG. 59 illustrates pads 672 and also illustrates pins 692, 693, and 694. The purpose of these pins is discussed further hereunder.

Figure 60:
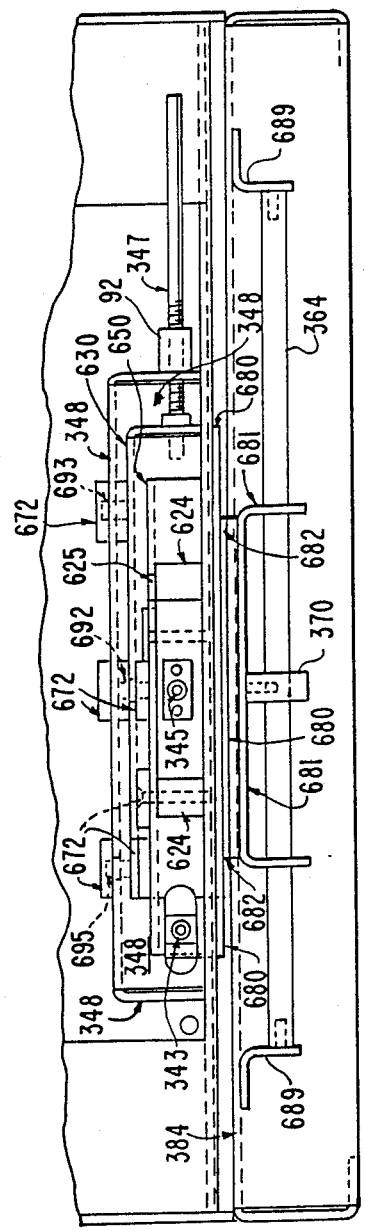
FIG. 60 is a front elevational view, of the apparatus of FIG. 58, shown partially in section, portions of the figure which are drawn in solid outline actually being a phantom view of underlying parts.

FIG. 60 is a front elevational view of the assembled components of the translatable work station. As seen in FIG. 60, a plurality of spacer pads 672 are provided to permit sliding between adjacent plates. As seen in FIG. 60, plate 650 is received within a shoulder 625 of the ring-shaped member 624 or rotation thereabout. Plate 630 is supported by the plate 650 and is guided by pins 692 and 694 (the latter pin being shown in FIGS. 64–66). The plate 630 supports plate 348, and guides plate 348 via pins 693 and 695 which are received in corresponding slots formed in the plate 348. Rod 347 is visible in FIG. 60 for adjustment of plate 348 in the X direction via threaded engagement with collar 92. A distal end of the rod 347 is received rotatably by a mounting in the plate 630. In this view, block 370 is shown which rides on one of the rails 364, and block 682 is shown which supports plate 680 thereon. The block 682 is supported by the plate 681. Additionally, mounting bracket 689, 689 are seen for mounting the rails 364 to a fixed support.

Figure 61:
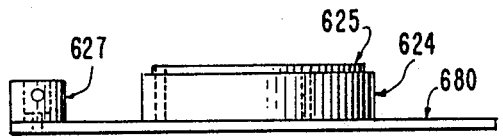
FIGS. 61, 62 and 63 are respectively front, right-hand side elevational, and top elevational views of a plate and ring of the work holding apparatus of FIG. 58.
Figure 62:
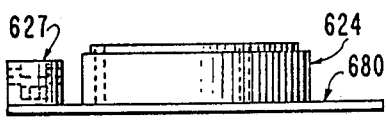
Figure 63:
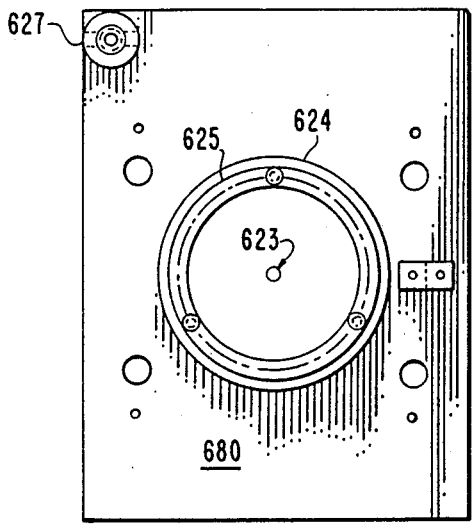

FIGS. 61, 62, and 63 are respectively front elevational, right hand side elevational, and top elevational views of the plate 680 and ring 624. The shoulder 62 is clearly seen in these figures, as is a threaded mounting block 627 which threadedly receives the rod 343.

FIGS. 64, 65, and 66 are respectively front elevational, right hand side elevational, and top elevational views of the plate 650 which overlies the ring 624. As seen in these figures, a pair of guide pins 692 and 694 are fixedly attached to the top surface 110 of the plate 650. The attachment of the distal end of the rod 343 is seen in FIG. 66, this joint preferably being a ball joint to permit angular movement of the rod 343. Slots 104 and 106 are seen in these figures, as is the central opening 108 which is received within the shoulder 625 of the ring 624 for rotatable support thereon. A plurality of spacers 672 are shown in these figures. As seen in FIG. 66, the guide rod 345 is threadedly engaged with a portion of the front wall of the plate 650, to drive movement in a wide direction of an overlying plate 630, discussed hereunder.

FIGS. 67A, 67B, and 67C are respectively a front elevational, right hand side elevational, and top elevational views of a plate 630 having slots 152 and 154 therein. Plate 630 has a top surface 142 which fixedly carries a pair of pins 693 and 695. These pins are used to guide travel of the next overlying plate 348. A rod 345 is rotatably connected to a side wall 144 of the plate 630 as seen in these figures. A collar 146 is seen in these figures for reception of the rod 345. The collar preferably rotatably supports the rod 345 therein for adjustment of the plate 630 in the Y travel direction guided by pins 692 and 694 which are fixedly attached to the plate 650. The slots 152 and 154 snugly receive the pins 692 and 694 to ensure accurate linear travel of the plate 630. A plurality of spacers 672 are illustrated in these figures, and are provided for support of the next overlying plate 348.

FIGS. 68A and 68B are respectively front elevational and right hand side elevational views of the plate 348.

FIG. 69 is a top elevational view of the plate of FIGS. 68A and 68B. Here, a plurality of slots 134, 136, 138, and 140 are seen for receiving pins therein. In the preferred embodiment, pins are provided only for slots 134 and 138. These slots are sized to snugly receive pins 693 and 695 which are secured to the plate 630, to ensure precise linear travel of the plate 348 relative to the plate 630. A plurality of spacers 672 are shown in these figures. A front slot 120 is seen in FIG. 68A for passage of the rod 343 completely therethrough. A front notch 122 is also shown in this figure for passage of the rod 345 therethrough. A threaded collar 124 is seen in these figures for threaded engagement with the rod 347, which thereby causes linear displacement of the plate 348 relative to the plate 630. The plate 348 has a top wall 127, front wall 126, and side walls 128 and 130.

Figure 70A:
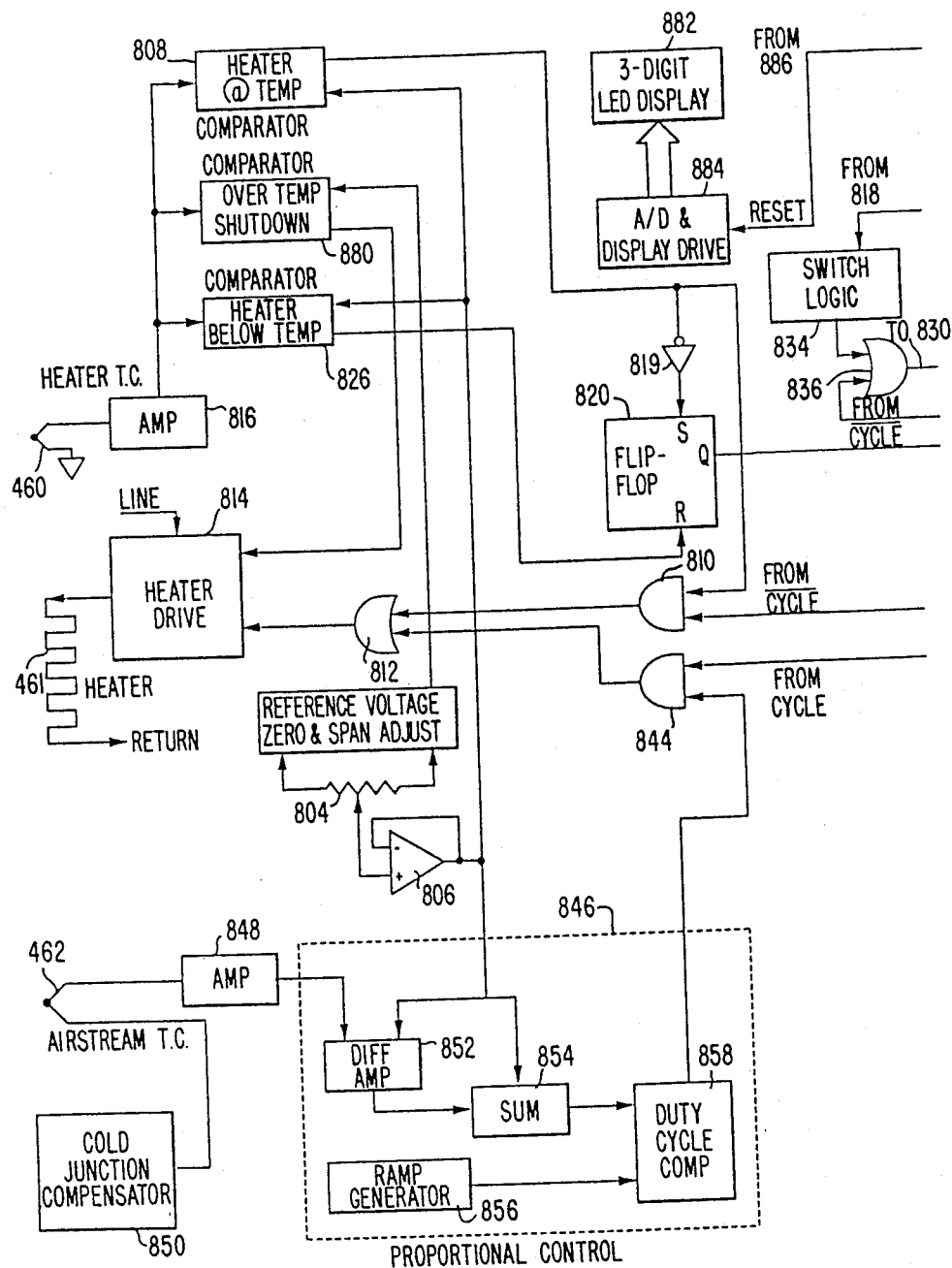
FIGS. 70A and 70B together are a schematic diagram of illustrative temperature control circuitry employed in the invention.
Figure 70B:
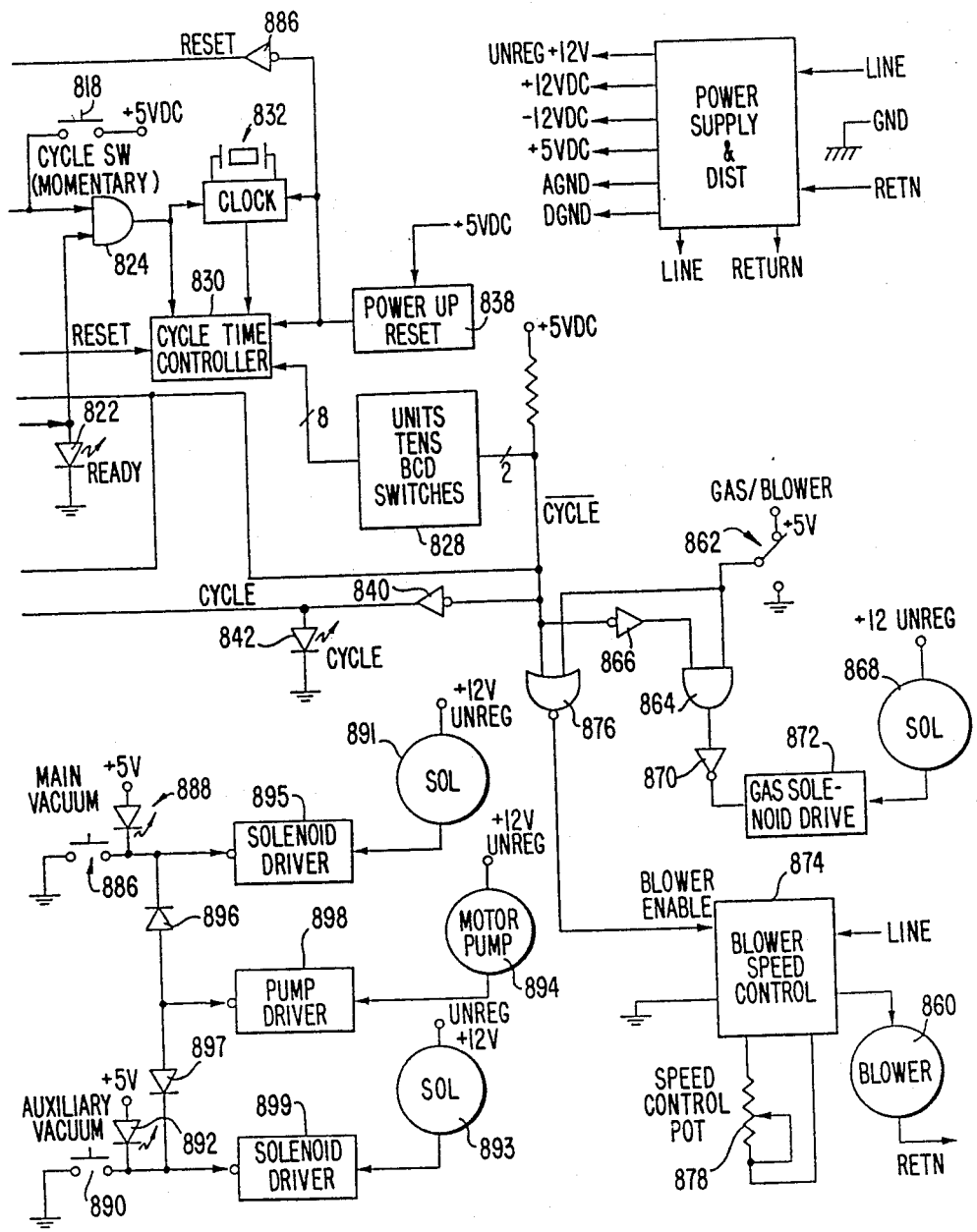

Heater thermocouple 460 and air stream thermocouple 462 are respectively connected to control circuitry shown in FIGS. 70A and 70B. The circuit operation is initiated by a double pole double throw power switch (not shown) on the console 330 in the line and return lines (FIG. 70B) applied to the power supply and distributor 802. With the closure of the power switch appropriate control voltages are applied to the various elements of the control circuitry whereby initially the heater 461 is brought up to its idle temperature depending upon the temperature set at the potentiometer 804 (FIG. 70A) where the potentiometer is controlled from the console in a conventional manner. The output from the potentiometer is applied to a follower circuit 806 which serves as a buffer. As long as the heater temperature is below the set temperature, the heater at temperature comparator 808 (which is responsive to heater thermocouple output via amplifier 816 and the output of potentiometer 804), will apply a ONE signal to the upper input of AND gate 810 which, in turn, is applied through the OR gate 812 to drive the heater 461 via heater drive 814 until the set temperature is reached.

An inverted CYCLE signal is applied to the other input of AND gate 810 and thus as long as the reflow cycle switch 818 (FIG. 21B) is not actuated, AND gate 810 will be actuated as long as the heater has not reached its set idle temperature.

Once heater 461 is brought up to its idle temperature, the output of comparator 808 is inverted whereby a ZERO signal is applied to AND gate 810 to de-activate the gate and turn off the current through heater 461. Moreover, via inverter 819, a ONE signal is applied to the S input of a flip-flop 820 to cause a ONE signal at the Q output thereof to thereby actuate the READY light 822 (FIG. 70B) and also apply a ONE signal to the lower input of the AND gate 824. Once the READY light turns on, the cycle switch at the console may be actuated to initiate a reflow cycle - that is, a component installation or removal cycle. Prior to actuation of cycle switch 818, the heater below temperature comparator 826 (FIG. 70A), which is also responsive to the outputs of heater thermocouple 460 and potentiometer 804, will be actuated if the heater temperature falls below two-thirds of the set idle temperature for the heater whereby flip-flop 820 will be reset at its R input and READY light 822 will be turned off. Moreover, current will be reapplied to heater 461 under the control of comparator 808 until the idle temperature of the heater is once again reached, as described above.

The duration of the reflow cycle is set at the console by two thumbnail switches 828. The outputs of switches 828 are applied to a cycle time controller 830 which operates under the control of a crystal controlled clock 832, which in turn is initiated by the output of AND gate 824, the AND gate being actuated when both the READY light is on and the reflow cycle switch 818 has been closed. The output of the reflow cycle switch is also applied to a switch logic circuit 834 (FIG. 70A), the output of which is applied through an OR gate 836 to start cycle time controller 830 to thus initiate the reflow cycle, which may typically last from 0 to 99 seconds, as determined by switches 828. The reflow cycle switch 818, if actuated during the reflow cycle will abort the reflow cycle, the switch logic 834 being responsive to the this actuation to apply a reset signal to the cycle time controller to abort the cycle. The powerup reset 838 is actuated to apply a reset signal to various circuits including the controller 830 when the double pole double throw power switch is closed. When the reflow cycle is completed, a CYCLE signal goes low to reset the controller 830 via OR gate 836.

During the reflow cycle, the output of an inverter 840 is applied as the CYCLE signal to a CYCLE light 842 on the console to indicate the reflow cycle is in process. The CYCLE signal is also applied to the upper input of an AND gate 844 (FIG. 70A). The lower input of AND gate 844 is connected to the output of a proportional control circuit 846, which circuit is responsive to (a) an air stream thermocouple 462 via an amplifier 848 and (b) potentiometer 804. The thermocouple 462 is also connected to a known cold junction compensator 850 which insures a zero voltage output from the thermocouple at 0° C. When reflow cycle 818 switch is closed, air stream thermocouple 462 measures the air stream temperature and drives the heater 461 via proportional control circuit 846, AND gate 844, OR gate 812, and heater drive 814 until the air stream temperature reaches the temperature set at potentiometer 804.

Proportional control circuit 846 may be of any known type of this circuit. Moreover, a comparator such as comparator 808 may be employed in place of the proportional control circuit. The purpose of the proportional control circuit is to drive the heater such that the air stream temperature as measured by thermocouple 461 matches the SMD temperature as set by potentiometer 804. The use of the proportional control circuit with respect to an ON-OFF controller allows more precise temperature control and increased stability.

In operation, the difference between the airstream thermocouple voltage and the potentiometer voltage is determined by differential amplifier 852 and applied to a sum circuit 854, which also has applied thereto the set voltage from potentiometer 804. The output of the sum circuit 854 and a ramp generator 856 are applied to a comparator 858, the duty cycle of the pulse train output of which is a function of the input signals applied thereto. In particular, the output of the ramp generator is a train of sawtooth waveforms having a repetition rate of typically about 3 Hz, the average value of the sawtooth waveforms being proportional to the value of the voltage established at potentiometer 804. The proportional control circuit 846 thus monitors the air stream temperature and adjusts the heater current accordingly. Upon actuation of the reflow cycle switch 818, either (a) pressurized gas (including air) from a tank or a line source (not shown) or (b) air from a blower 860 (FIG. 70B) is applied to the heater as shown in FIG. 4. In the upper position of a gas/blower switch 862, pressurized gas is applied to the heater 461, this being effected by application of a ONE signal to the right input of AND gate 864 and an inverted, inverted CYCLE signal to the left input thereof via inverter 866 whereby the AND gate is conditioned to drive the line or tank solenoid 868 via an inverter 870 and a gas solenoid drive circuit 872. At this time, the blower speed control 874 is disabled because of the ONE output applied from switch 862 to NOR gate 876.

When the air blower switch 862 is in the grounded blower position, two logical low signals are applied through the NOR gate 876 to enable the blower speed control circuit and thus actuate the blower 860 to apply air to the heater 461. Air flow rate control through the heater is effected by speed control pot 878 connected to the blower speed control.

With the gas (including air) flowing, the heater will raise the temperature thereof until the air stream reaches the desired temperature thereof set at potentiometer 804. As stated above, air stream thermocouple 462 controls the heater drive during the reflow cycle established by cycle switch 818 and only during this time. Since the air stream thermocouple is located below and preferably removed from the heater, this will cause the heater to be driven at a temperature above its idle temperature in order that the air stream temperature can reach its desired temperature. Once the desired air stream temperature is reached, the proportional control circuit 846 will continually monitor the air stream temperature and adjust the heater current accordingly. Hence, the air stream will remain substantially at its desired temperature as long as the CYCLE signal established by the cycle switch 818 is at logical ONE. When the reflow cycle is over, control of the heater drive circuit is switched back to the heater thermocouple 461 whereby the heater is returned to its idle temperature.

If at any time, the heater thermocouple senses a temperature above that set at an over temperature comparator 880 (FIG. 70A), a signal is applied to the heater drive to turn the heater off and thus avoid heater burn out.

By maintaining the heater at a idle temperature, it is possible to have the heater ready whenever a reflow cycle is needed. That is, it is not necessary to bring the heater up to temperature each time a processing cycle is required. Moreover, by having a second sensor in the air stream near where the air effects melting of the solder, the temperature of the air at the joints is more closely and accurately controlled to that required for the melting operation.

Actuation of a main vacuum switch 886 actuates a main vacuum light 888, the main vacuum being used at the reflow station where a component is removed or installed (the vacuum being applied to vacuum pick 424 of FIG. 5) while an auxiliary vacuum is applied to vacuum pick 303 at the alignment viewing station upon actuation of switch 890, which also turns on LED 892. Either or both of the above vacuums are available from pump 894 via diodes 896 and 897 and pump driver 898. Solenoid valves 891 and 893 are also respectively responsive to switches 886 and 890 via drivers 895 and 899 where valves 891 and 893 are respectively in the lines to picks 424 and 303 to connect these picks to pump 894 when their associated switches 886 and 890 are closed and to bleed these picks to the atmosphere when their associated switches are open.

As can be appreciated from the foregoing, potentiometer 804 is used to both establish the idle temperature of heater 461 and the desired temperature of the air stream in the preferred embodiment of FIGS. 70A and 70B. It is also within the scope of the present invention to provide separate potentiometers for establishing the idle temperature of the heater and the desired temperature of the air stream.

In operation, alignment of the SMD with respect to the board is accomplished at the blower or reflow station 310 (as opposed to camera or separate viewing station 320) in the following manner, this embodiment of the intention preferably being utilized whenever SMD's of the first group are being installed where the first group is defined in the foregoing section entitled "Background and Summary of the Invention". First the new SMD is inserted in the nozzle 422 to effect alignment of the SMD with respect to the nozzle due to locator means in the nozzle as described above. Next, the vacuum tube 400 is attached to the SMD by application of vacuum through tube 400 and then the tube 400 (with the SMD attached thereto) is lowered to and held at a position substantially below the heater assembly nozzle and slightly above the board, this being effected, for example by removing member 434 from groove 432 and then lowering the tube 400 until member 434 engages groove 430. The position of the positioning or work table supporting the PCB is then adjusted until accurate alignment of the SMD leads with respect to the PCB lands is effected typically utilizing the above-mentioned optical aids. Once alignment is effected, the vacuum tube is further lowered and held in place by threaded member 426 to press the leads against the lands and thus ensure good mechanical and eventual electrical connection between all leads and their associated lands. Next, the heater assembly 310 including its nozzle 420 is lowered to the PCB 340 by operation of member 302 so that the nozzle is in reflow relation to the SMD. Reflow is next effected by delivering heated air to the nozzle to thus solder the SMD to the PCB. The vacuum tube may then be released and raised from the SMD and the heater assembly also raised. The attached SMD may be then be translated to the separate station 302 for final inspection by translating the worktable as discussed above. As also mentioned above, various preparatory functions such as cleaning and pretinning may also be effected at station 302. Moreover, translation of the worktable is effected to the side of the reflow station in the above embodiment. It may also be translated forward of the reflow station particularly when the alignment of the SMD with respect to the board occurs at the reflow station.

In further operation of the invention, alignment of the SMD with respect to the board is accomplished at the separate viewing station 320 (as opposed to the reflow station 310) in the following manner, this embodiment of the invention preferably being utilized whenever SMD's of the second group (gull-wing leaded carriers with fine lead spacing, for example) are being installed. Subsequent to the removal of a defective SMD at the reflow station, the PCB is translated a predetermined distance to the viewing station 320 preparatory to the alignment of the new SMD with the PCB 340. The new SMD is inserted into a cup-shaped member 608 (FIG. 54), the internal configuration of which corresponds to that of the new SMD. The cup-shaped member is removably attachable to the vertical portion of a tubular vacuum pick 303 (FIG. 1) whereby vacuum is applied to the interior of the cup-shaped member 608 to secure the SMD therein. The leads of the SMD extend beyond the periphery of the cup-shaped member to thus permit alignment of the leads with the lands on the PCB where substantially unobstructed vertical viewing of all four sides of the SMD is available. Different cup-shaped members may be connected to the vacuum tube depending upon the particular SMD being processed. Preferably the vacuum tube 303 is rotatable from a first position (shown in solid lines in FIG. 1) which is in alignment with the nozzle of the heater at the reflow station 310 to a retracted second position 303' (shown in dotted lines) where the new SMD can be inserted either manually or automatically into the cup-shaped member. In automatic operation, the cup-shaped member may remove the SMD's from a chute (not shown) or the like.

The first position of the vacuum tube 303 corresponds to an aligned position with respect to the nozzle of the heater assembly, as stated above. In particular, the substrate work holder 360 is translatable from the reflow station to a position in substantially precise alignment with the first position of the vacuum tube 303. With the new SMD inserted in the cup-shaped member 608, the alignment of the new SMD with the lands on the PCB may be effected by adjusting the position of the work table 360 until alignment occurs. This is facilitated, especially when the number of leads is very large, as discussed above, by permitting substantially unobstructed vertical viewing of all four sides of the new SMD, the diameter of tube 303 typically being small in comparison to the length or width dimensions of the SMD. Alignment is effected while the spacing between the new SMD and the lands on the PCB is very slight, preferably substantially less than 1/16 of an inch.

As discussed above, prior to the alignment procedure, the lands on the PCB may be cleaned and pretinned, if necessary, while the vacuum tube 303 is in its retracted position 303'. Also, a tacky flux is applied to the lands at this time, such tacky fluxes being known and used in the above-described mass production processes.

After alignment has occurred, the leads of the new SMD are gently placed on the lands of the PCB by gently lowering the tube 303 using means, for example, such as those employed in phonograph tone arms. The vacuum is then removed whereby the leads are now semi-permanently attached to the lands by the tacky flux.

Alignment of the SMD with the PCB 340 having now been accomplished, alignment of the SMD with the nozzle of the heater assembly of the reflow station 310 is next effected. Assuming the SMD had been properly centered within the cup-shaped member 608, it can be assumed that the SMD will be properly aligned with the reflow nozzle when the substrate is moved back to the reflow station since means, as described above, are provided to ensure precise movement of the worktable between the reflow station 310 and the viewing station 320. Alignment of the SMD within the cup-shaped member 608 can be sufficiently ensured by providing locating means within the cup-shaped member similar to that discussed hereinbefore within the heater assembly nozzle. If such locating means are not employed, additional means are provided, in accordance with a further aspect of the invention, to adjust the new SMD to a further position, if necessary, from which the work table can now be translated back to the reflow station nozzle with assurance that the new SMD will be aligned with the nozzle at the reflow station. Accordingly, the cup-shaped member may be removed from the vertical portion of the tube 303 (after the vacuum has been removed) and then a mechanical reticle 610 (FIG. 55) is next positioned on the vertically extending portion of the vacuum tube 303, the reticle comprising a transparent membrane with a plurality of grid lines which correspond to the configurations of the various SMD's that may be processed With the invention. The reticle 610 is precisely positioned on the vacuum tube 303 so that when the new SMD is aligned with the reticle holes corresponding to the shape thereof, the SMD will be aligned with the heater assembly nozzle when it is returned to the reflow station. Precision positioning of the cup-shaped member and the mechanical reticle on the vertical portion of tube 303 may be effected by known means such as (a) a key arrangement or (b) corresponding flat portions on (i) the tube and (ii) the cup-shaped member and the reticle. Alignment of the SMD with the reticle holes is effected simply by the operator viewing the SMD through the reticle holes and positioning the work table 360 until alignment is effected. The SMD may now be returned to the reflow station 310. The nozzle 420 of the heater assembly is then lowered around the SMD to solder the SMD to the PCB in the manner described above. After the SMD has been soldered to the PCB, the heater assembly is raised and the SMD is again returned to the viewing station where all four sides thereof are inspected to ensure proper connection of the SMD to the board. It is particularly important in this final inspection that unobstructed, vertical viewing of all four sides of the component be available and, as can be appreciated from the foregoing, this is available with the present invention whether the alignment occurs either at the reflow station 310 or at the separate viewing station 320.

Another feature of the invention is that a second reflow station may also be provided at viewing station 320 in either in place of or in addition to the viewing station. The second reflow station would be of the type more suitable for the removal and installation of chip capacitors, resistors, and transitors, such components not being conveniently handled by the reflow station at 310 which is more suitable for integrated circuit carriers, as discussed above.

What is claimed:

1. A heater assembly or removing or attaching electronic components with respect to a substrate, solder being associated with the components, comprising:
   means for delivering a gas;
   heater means for heating the gas;
   nozzle means for directing the heated gas to said solder applied to the leads of said electronic component and/or lands of said substrate where said component is:
   first temperature sensing means for sensing the temperature of said heater means;
   second temperature sensing means for sensing the temperature of said heated air;
   temperature control means responsive to said first and second temperature sensing means for controlling the temperatures of said heater means and said heated air substantially independently of one another; and the solder applied to the leads of an electronic component and/or lands or a substrate is heated to effect removal or attachment of the component with respect to said substrate via said leads and lands.

2. A heater assembly as in claim 1 where said second temperature sensing means is disposed closer to said nozzle means than said first temperature sensing means.

3. A heater assembly as in claim 1 where said temperature control means includes means for controlling the temperature of said heated air until said heated air reaches a predetermined temperature.

4. A heater assembly as in claim 1 including temperature setting means for setting the temperature of the heated air to an adjustable predetermined temperature and means for comparing said adjustable, predetermined temperature with the heated air temperature as measured by said second temperature sensing mean to control the heated air temperature to the adjustable, predetermined temperature to thus provide sufficient heat to melt said solder in spite of the different amounts of said heat that may be required by different components and/or substrates.

5. A heater assembly as in claim 1 including means for adjusting the flow rate of said heated air.

6. A heater assembly for removing or attaching electronic components with respect to a substrate, solder being associated with the components, comprising:
   means for delivering a gas; and heater means for heating the gas, said heater means including
   an elongated member having at least one groove in a first outer portion of the side thereof, said groove extending in the direction of elongation of the elongated member;
   an internal passage through which said gas passes;
   a heating element for heating said gas as it passes through the internal passage;
   a first temperature sensing member having an elongated support;
   at least two rows of spaced apart teeth outwardly projecting from the outer portions of the side of the elongated member other than said first outer portion, said rows of teeth also extending in the direction of elongation of the elongated member,
   said rows of teeth receiving said heating element and said groove receiving at least the elongated support of said first temperature sensing member with its elongated support,
   the heater element being formed around at least the elongated member; and the solder applied to the leads of an electronic component and/or lands of a substrate is heated to effect removal of attachmet of the component with respect to said substrate via said leads and lands.

7. A heater assembly as in claim 6 where said first temperature sensing member is disposed within said groove to sense the temperature of said heating element.

8. A heater assembly as in claim 6 where the elongated support of the first temperature sensing member extends beyond said elongated member so that the first temperature sensing member is disposed within the heated air to sense the temperature thereof.

9. A heater assembly as in claim 6 including a second temperature sensing member having an elongated support and where the elongated member includes a second groove therein for receiving said elongated support of the second temperature sensing member, said elongated support of the second temperature sensing member extending beyond said elongated member into the gas heated by the heating element;
   wherein said first temperature sensing member senses the temperature of the heating element and the second temperature sensing member senses the temperature of heated gas.

10. A heater assembly as in claim 6 where said heater means includes a nozzle means connected to the elongated member for directing the heated gas to an object to be heated and where said second temperature sensing means is disposed at least adjacent to said nozzle.

11. A heater assembly as in claim 6 where the spatial relationship between the outwardly projecting teeth and the groove is such that said heating element may be formed around the elongated member without substantial interference from the elongated support of the first temperature sensing member.

12. A heater assembly as in claim 6 where said first temperature sensing member is a thermocouple.

13. A heater assembly as in claim 6 where said heating element is a heater coil.

* * * * *